US007244543B2

(12) United States Patent
Aoai

(10) Patent No.: US 7,244,543 B2
(45) Date of Patent: Jul. 17, 2007

(54) LITHOGRAPHIC PRINTING STARTING PLATE

(75) Inventor: Toshiaki Aoai, Shizuoka (JP)

(73) Assignee: Fujifilm Corporation, Tokyo (JP)

(*) Notice: Subject to any disclaimer, the term of this patent is extended or adjusted under 35 U.S.C. 154(b) by 0 days.

(21) Appl. No.: 10/945,971

(22) Filed: Sep. 22, 2004

(65) Prior Publication Data

US 2005/0064340 A1 Mar. 24, 2005

(30) Foreign Application Priority Data

Sep. 24, 2003 (JP) ............................ 2003-332071

(51) Int. Cl.
*G03F 7/029* (2006.01)

(52) U.S. Cl. ............................... 430/270.1; 430/271.1; 430/278.1; 430/302; 430/309; 430/434; 430/435; 430/494; 430/944; 430/945

(58) Field of Classification Search ............. 430/270.1, 430/271.1, 278.1, 302, 309, 434, 435, 494, 430/944, 945
See application file for complete search history.

(56) References Cited

U.S. PATENT DOCUMENTS

| | | | | |
|---|---|---|---|---|
| 5,576,143 | A * | 11/1996 | Aoai et al. | 430/270.1 |
| 5,731,123 | A * | 3/1998 | Kawamura et al. | 430/176 |
| 6,423,467 | B1 * | 7/2002 | Kawauchi et al. | 430/270.1 |
| 2003/0022094 | A1 * | 1/2003 | Nakamura et al. | 430/157 |
| 2004/0185378 | A1 * | 9/2004 | Kodama et al. | 430/311 |
| 2005/0123859 | A1 * | 6/2005 | Wada et al. | 430/313 |
| 2005/0142484 | A1 * | 6/2005 | Watanabe et al. | 430/270.1 |
| 2005/0214675 | A1 * | 9/2005 | Watanabe et al. | 430/270.1 |

FOREIGN PATENT DOCUMENTS

| | | | |
|---|---|---|---|
| EP | 0 146 411 | A2 | 6/1985 |
| EP | 0 625 728 | A2 | 11/1994 |
| EP | 1 223 467 | A2 | 7/2002 |
| EP | 1 236 569 | A2 | 9/2002 |
| EP | 1 275 498 | A2 | 1/2003 |
| JP | 60-175046 | A | 9/1985 |
| JP | 10-282643 | A | 10/1998 |

OTHER PUBLICATIONS

European Search Report dated Oct. 19, 2005.

* cited by examiner

*Primary Examiner*—Barbara L. Gilliam
(74) *Attorney, Agent, or Firm*—Sughrue Mion, PLLC

(57) ABSTRACT

A positive-working lithographic printing starting plate for an infrared laser is provided that includes a support having a hydrophilic surface and a heat-sensitive layer provided above the support. The heat-sensitive layer includes a water-insoluble and alkali-soluble resin, an infrared-absorbing dye, and a sulfonium salt represented by Formula below. The heat-sensitive layer increases its solubility in aqueous alkaline solution upon exposure to an infrared laser.

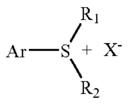

(In the formula, $R_1$ and $R_2$ independently denote an optionally substituted alkyl group having 1 to 12 carbons, an optionally substituted cycloalkyl group having 3 to 8 carbons, an optionally substituted aralkyl group having 7 to 12 carbons, or an optionally substituted aryl group having 6 to 15 carbons, $R_1$ and $R_2$ may bond to each other to form a cyclic structure; Ar denotes an optionally substituted aromatic hydrocarbon group having 6 to 15 carbons and having at least one OH group at the ortho- and/or para-position; and $X^-$ denotes an anion of an organic acid.)

19 Claims, No Drawings

LITHOGRAPHIC PRINTING STARTING PLATE

BACKGROUND OF THE INVENTION

1. Field of the Invention

The present invention relates to an image recording material that can be used as an offset printing master and, in particular, to a positive-working lithographic printing starting plate for an infrared laser for so-called direct platemaking, in which platemaking can be carried out directly from a digital signal sent from a computer, etc.

2. Description of the Related Art

The development of lasers in recent years has been remarkable and, in particular, with regard to solid-state lasers and semiconductor lasers having emission regions from near-infrared to infrared, compact devices having high output are readily available. These lasers are very useful as exposure light sources when carrying out direct platemaking by means of scanning exposure based on a digital data signal sent from a computer, etc.

A lithographic printing material is a material used for making a lithographic printing starting plate having a heat-sensitive layer or a light-sensitive layer. With regard to a positive-working lithographic printing plate material for an infrared laser, an aqueous alkaline solution-soluble binder resin, an infrared-absorbing dye (hereinafter also called an ‘IR dye’) that absorbs infrared light and generates heat, etc. are essential components; in unexposed areas (image areas) the IR dye, etc. functions as a dissolution inhibitor that substantially degrades the solubility of the binder resin by interacting with the binder resin, and in exposed areas (non-image areas) heat generated therein weakens the interaction between the IR dye, etc. and the binder resin, they dissolve in an alkaline developer, and a hydrophilic surface of a support is exposed, thereby forming a lithographic printing plate.

However, in such a positive-working lithographic printing plate material for an infrared laser in which unexposed areas (image areas) are receptive to a printing ink, it cannot be said that there is sufficient difference between the dissolution resistance to the developer in unexposed areas (image areas) and the solubility in exposed areas (non-image areas) under various conditions of use, and there is the problem that overdevelopment and underdevelopment easily occur due to variations in the conditions of use. Furthermore, fine scratches are formed by, for example, touching the surface during handling, the surface state is thus easily changed, and when such fine scratches or a slight change in the surface state occurs, the solubility increases, and the unexposed areas (image areas) dissolve during development, thus forming scratch marks; since image defects occur in image areas, there are the problems that degradation in plate life and incomplete laydown are caused.

Such problems are due to an intrinsic difference in platemaking mechanism between the positive-working lithographic printing plate material for an infrared laser and a positive-working lithographic printing plate material that is processed by UV exposure. That is, the positive-working lithographic printing plate material processed by UV exposure contains as essential components an aqueous alkaline solution-soluble binder resin and an onium salt or a quinone diazide compound, and this onium salt or quinone diazide compound not only functions as a dissolution inhibitor by interaction with the binder resin in unexposed areas (image areas) but also functions as a dissolution promoter in exposed areas (non-image areas) by decomposing under light and generating an acid.

In contrast, the IR dye, etc. in the positive-working lithographic printing plate material for an infrared laser functions only as a dissolution inhibitor for unexposed areas (image areas) and does not promote dissolution in exposed areas (non-image areas). Therefore, in order to enhance the difference in solubility between unexposed and exposed areas of the positive-working lithographic printing plate material for an infrared laser, a binder resin having high solubility in an alkaline developer must be used, and there are the problems that the scratch resistance is poor and the state prior to development is unstable.

As a method for increasing the difference in solubility between exposed and unexposed areas, JP-A-10-282643 (JP-A denotes a Japanese unexamined patent application publication) discloses that in alkali development, the proportion of film remaining in unexposed areas is improved by adding an organic acid to a positive type light-sensitive composition containing a light-heat converting substance and an alkali-soluble resin. Furthermore, JP-A-2001-324808 discloses a positive type light-sensitive composition containing a light-heat converting substance and a specific mass ratio of a novolac resin and an acrylic resin, thereby giving a system having a high sensitivity and an improved proportion of film remaining in unexposed areas. Furthermore, JP-A-11-143076, JP-A-11-190903, and the like disclose that a combination of an alkali-soluble resin having phenolic hydroxyl groups and an acidic color-developing dye or a basic color-developing dye enables the proportion of film remaining in the unexposed areas and the contrast between unexposed and exposed areas to be improved.

However, even in the techniques disclosed above, the difference in alkali solubility between exposed and unexposed areas (the so-called dissolution discrimination) is not large, resulting in insufficient development latitude. In addition, further improvement in sensitivity is also desired in order to heighten productivity in the platemaking of the lithographic printing plate.

As a method for improving the above-mentioned problems, a heat-sensitive layer having a multilayer structure has been proposed (ref. JP-A-10-250255). However, in this method a change in solubility is in practice not used in a key process of image formation; instead, it employs a function of changing the penetration of a developer by abrasion of an upper layer, and various problems are caused due to the abrasion. Moreover, there is a known recording layer in which a novolac resin is used in an uppermost layer and a lower layer, an image being formed by utilizing variation in solubility in a silicate-containing alkaline developer, but an adequate difference in solubility between unexposed areas and exposed areas could not be obtained (ref. JP-A-11-223935). There is also known a positive-working lithographic printing starting plate having as an upper layer a heat-sensitive layer that becomes soluble in an alkali by exposure to an infrared laser and as a lower layer an alkali-soluble polymer layer, the positive-working lithographic printing plate being developed with an alkaline developer containing as main components a base and an organic compound having a buffering action, but a further enhancement of the difference in solubility between unexposed areas and exposed areas and, in particular, of the solubility of the exposed areas (the so-called dissolution promotion) is desired (ref. JP-A-2002-182400).

BRIEF SUMMARY OF THE INVENTION

It is an object of the present invention to provide a positive-working lithographic printing starting plate for use in direct platemaking with an infrared laser, the positive-working lithographic printing starting plate giving excellent sensitivity and development latitude (particularly developability of exposed areas) during image formation, suppressing the occurrence of defects due to scratches in unexposed areas (image areas) of an image, and forming a good image.

This object of the present invention is attained by the following means.

(1) A positive-working lithographic printing starting plate for an infrared laser, comprising a support having a hydrophilic surface and a heat-sensitive layer provided above the support, the heat-sensitive layer comprising a water-insoluble and alkali-soluble resin (A), an infrared-absorbing dye (B), and a sulfonium salt (C) represented by Formula (I), and the heat-sensitive layer increasing its solubility in aqueous alkaline solution upon exposure to an infrared laser.

(I)

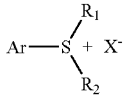

In the formula, $R_1$ and $R_2$ independently denote an optionally substituted alkyl group having 1 to 12 carbons, an optionally substituted cycloalkyl group having 3 to 8 carbons, an optionally substituted aralkyl group having 7 to 12 carbons, or an optionally substituted aryl group having 6 to 15 carbons. $R_1$ and $R_2$ may bond to each other to form a cyclic structure. Ar denotes an optionally substituted aromatic hydrocarbon group having 6 to 15 carbons and having at least one OH group at an ortho- and/or para-position. $X^-$ denotes an anion of an organic acid.

Some preferred embodiments of the lithographic printing starting plate according to the above (1) and a development method therefor are listed below.

(2) The positive-working lithographic printing starting plate for an infrared laser according to (1), wherein it further comprises at least one lower layer containing as a main component a water-insoluble and alkali-soluble resin, the lower layer being provided between the heat-sensitive layer and the support having a hydrophilic surface.

(3) The positive-working lithographic printing starting plate for an infrared laser according to (1), wherein the alkali-soluble resin (A) is a polymer compound obtained by homopolymerization of one of a polymerizable monomer having a phenolic hydroxyl group, a polymerizable monomer having a sulfonamide group, and a polymerizable monomer having an active imide group, or by copolymerization of two or more monomers thereof, or a polymer compound obtained by copolymerization of one or more monomers of the polymerizable monomers with another copolymerizable monomer.

(4) The positive-working lithographic printing starting plate for an infrared laser according to (1), wherein the amount of infrared-absorbing dye (B) added is 0.01 to 50 wt % of the total solids content of the heat-sensitive layer.

(5) The positive-working lithographic printing starting plate for an infrared laser according to (1), wherein the amount of sulfonium salt (C) added is 0.1 to 30 wt % of the total solids content of the heat-sensitive layer.

(6) The positive-working lithographic printing starting plate for an infrared laser according to (1), wherein $X^-$ of the sulfonium salt (C) represented by Formula (I) is an anion of an organic acid having a perfluoroalkyl group as a substituent.

(7) The positive-working lithographic printing starting plate for an infrared laser according to (1), wherein the substituents allowed for $R_1$, $R_2$, and Ar of the sulfonium salt (C) represented by Formula (I) are an alkyl group having 1 to 8 carbons, a cycloalkyl group having 3 to 8 carbons, a haloalkyl group having 1 to 5 carbons, an alkoxy group having 1 to 8 carbons, an amide group, a ureido group, a urethane group, a hydroxyl group, a carboxyl group, a halogen atom, a thioether group, an acyl group having 1 to 5 carbons, an acyloxy group having 1 to 5 carbons, an alkoxycarbonyl group having 1 to 4 carbons, a cyano group, or a nitro group.

(8) The positive-working lithographic printing starting plate for an infrared laser according to (1), wherein the support is a polyester film or an aluminum sheet.

(9) The positive-working lithographic printing starting plate for an infrared laser according to (2), wherein it further comprises an organic undercoat layer between the support and the lower layer.

(10) The positive-working lithographic printing starting plate for an infrared laser according to (1), wherein the coat weight of the heat-sensitive layer is 0.5 to 3.0 $g/m^2$.

(11) The positive-working lithographic printing starting plate for an infrared laser according to (2), wherein the coat weight of the heat-sensitive layer is 0.05 to 1.0 $g/m^2$, and the coat weight of the lower layer is 0.3 to 3.0 $g/m^2$.

(12) The positive-working lithographic printing starting plate for an infrared laser according to (2), wherein the alkali-soluble resin of the lower layer is an acrylic resin having an acidic group whose pKa value is 5 to 11.

(13) The positive-working lithographic printing starting plate for an infrared laser according to (9), wherein the coat weight of the organic undercoat layer is 5 to 100 $mg/m^2$.

(14) The positive-working lithographic printing starting plate for an infrared laser according to (1), wherein $R_1$ and $R_2$ of the sulfonium salt (C) represented by Formula (I) are independently a methyl group, an ethyl group, a propyl group, an n-butyl group, a sec-butyl group, a hexyl group, a 2-ethylhexyl group, an octyl group, a decanyl group, a dodecyl group, a cyclopropyl group, a cyclopentyl group, a cyclohexyl group, an adamantyl group, a norbornyl group, an isobornyl group, a camphanyl group, a dicyclopentyl group, an $\alpha$-pinyl group, a tricyclodecanyl group, a benzyl group, a phenethyl group, a naphthylmethyl group, a phenyl group, a tolyl group, a dimethylphenyl group, a 2,4,6-trimethylphenyl group, a naphthyl group, an anthryl group, or a 9,10-dimethoxyanthryl group, and Ar is a phenyl, tolyl, dimethylphenyl, naphthyl, or anthryl group having at least one OH group at an ortho- and/or para-position.

(15) The positive-working lithographic printing starting plate for an infrared laser according to (2), wherein the amount of alkali-soluble resin added to the lower layer is 70 to 95 wt % of the total solids content of the lower layer.

(16) The positive-working lithographic printing starting plate for an infrared laser according to (2), wherein the amount of infrared-absorbing dye added to the lower layer is 0.5 to 7 wt % of the total solids content of the lower layer.

(17) A development method for the positive-working lithographic printing starting plate for an infrared laser according to (1), wherein after the lithographic printing starting plate is imagewise exposed to an infrared laser, the lithographic printing starting plate is developed with a developer containing (a) at least one type of sugar selected from non-reducing sugars or at least one type of silicate compound, and (b) at least one type of base, the developer having a pH in the range of 9.0 to 13.5.

The lithographic printing starting plate of the present invention is imagewise exposed to light in the infrared region (infrared laser). The 'infrared laser' referred to here includes infrared light and near-infrared light having a wavelength of at least 700 nm and at most 3,000 nm, preferably 760 to 3,000 nm, and particularly preferably 760 to 1,500 nm. As long as a light component in this infrared region is included, light that includes a light component in the visible region can be used for imagewise exposure.

In accordance with the positive-working lithographic printing starting plate for an infrared laser of the present invention, excellent sensitivity and development latitude can be achieved, and although the detailed mechanism of action is unclear, it can be surmised to be as follows.

The arylsulfonium salt having a hydroxyl group at an ortho- and/or para-position added as Component (C) exhibits the action of improving the alkali solubility during development of exposed areas. The sensitivity of the positive-working lithographic printing starting plate for an infrared laser is essentially the sum of the exposure-based sensitivity (light absorption efficiency and light-heat conversion efficiency) and the dissolution-based sensitivity (dissolution rate enhancement efficiency of the exposed areas). In order to improve the exposure sensitivity of the lithographic printing starting plate, directly increasing the amount of IR dye (increasing the amount of light absorption) is effective, but since interaction between the IR dye and the binder resin is intensified, the solubility of the binder resin in exposed areas is reduced excessively, thus decreasing the dissolution sensitivity. It can be surmised that, even in such a case, the addition of Component (C) improves the solubility of the exposed areas in the developer, thereby improving the overall sensitivity. Furthermore, by adjusting the concentration of an alkali component in the developer in order to achieve high sensitivity, and controlling the solubility of exposed areas at an optimum value, it is possible to improve the dissolution inhibition in unexposed areas (image areas), that is, to improve the development latitude and the scratch resistance of the image areas, thereby advantageously suppressing image defects.

In the case of a heat-sensitive layer having no lower layer, which is a normal layer structure, the inhibition of dissolution by the interaction between the alkali-soluble resin and the IR dye is not sufficiently cancelled in a section of the exposed area close to the support because of heat diffusion to the support, and the solubility in that section tends to be low compared with the solubility in the vicinity of the surface, thus causing underdevelopment in some cases.

DETAILED DESCRIPTION OF THE INVENTION

Each of the components used in the positive-working lithographic printing starting plate for an infrared laser of the present invention is explained in detail below.

1. Positive-working Lithographic Printing Starting Plate for Infrared Laser of the Present Invention The positive-working lithographic printing starting plate for an infrared laser of the present invention has, on a support having a hydrophilic surface, a heat-sensitive layer whose solubility in aqueous alkaline solution increases on exposure to an infrared laser, and preferably has, between the support having the hydrophilic surface and the heat-sensitive layer (upper layer), at least one lower layer containing as a main component a water-insoluble and alkali-soluble resin. When the lithographic printing starting plate of the present invention includes the lower layer, the heat-sensitive layer is also called an 'upper layer'.

1-1. Heat-sensitive Layer (Upper Layer)

It is necessary for the heat-sensitive layer of the lithographic printing starting plate of the present invention to include a water-insoluble and alkali-soluble resin (A), an infrared-absorbing dye (B), and a sulfonium salt (C) represented by Formula (I) above. Components included as essential components are explained below.

Alkali-soluble Resin (A)

The water-insoluble and alkali-soluble resin (hereinafter called an 'alkali-soluble polymer' as appropriate) referred to in the present invention includes a homopolymer containing an acidic group in its main chain and/or side chain, a copolymer thereof, and a mixture thereof. The polymer layer of the present invention therefore has the property of dissolving on contact with an alkaline developer.

The alkali-soluble polymer used in the present invention is not particularly limited as long as it is known in the art, but is preferably a polymer compound having as a functional group in the molecule any one of (1) a phenolic hydroxyl group, (2) a sulfonamide group, and (3) an active imide group. Examples thereof are illustrated below, but should not be construed as being limited thereto.

(1) With regard to the polymer compound having a phenolic hydroxyl group, there can be cited novolac resins and resol resins formed by condensation between formaldehyde and an appropriate mixture of phenol, cresol (o-, m-, p-), and xylenol (2,3-, 2,5-, 3,5-, etc.). It is preferable to use the novolac resins, and examples thereof include novolac resins such as a phenol formaldehyde resin, a m-cresol formaldehyde resin, a p-cresol formaldehyde resin, an m-/p-mixed cresol formaldehyde resin, a phenol/cresol (any one of m-, p-, or m-/p-mixed) mixed formaldehyde resin, a phenol/xylenol (any one of 2,3-, 2,5-, 3,5-, and mixtures thereof) mixed formaldehyde resin, and a phenol/cresol (any one of m-, p-, or m-/p-mixed)/xylenol (any one of 2,3-, 2,5-, 3,5-, and mixtures thereof) mixed formaldehyde resin, and a pyrogallol acetone resin. With regard to other polymer compounds having a phenolic hydroxyl group, it is preferable to use a polymer compound having a phenolic hydroxyl group on its side chain. With regard to the polymer compound having a phenolic hydroxyl group on its side chain, there can be cited polymer compounds obtained by homopolymerization of a polymerizable monomer that is a low molecular weight compound having one or more phenolic hydroxyl groups and one or more polymerizable unsaturated bonds, or by copolymerization of the monomer with another polymerizable monomer.

With regard to the polymerizable monomer having a phenolic hydroxyl group, there can be cited an acrylamide, a methacrylamide, an acrylic acid ester, and a methacrylic acid ester that have a phenolic hydroxyl group, a hydroxystyrene, and the like. Specific examples of the polymerizable monomer preferably used include N-(2-hydroxyphenyl) acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 3-methyl-p-hydroxystyrene, 3-methoxy-p-hydroxystyrene, 2-(2-hydroxyphenyl)

ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, and 2-(4-hydroxyphenyl)ethyl methacrylate. Such resins having a phenolic hydroxyl group may be used in a combination of two or more types: With regard to the polymer compound having a phenolic hydroxyl group on its side chain, polyhydroxystyrenes (o-, m-, p-, and copolymers thereof) can be cited as suitable examples.

Such polymer compounds having a phenolic hydroxyl group can be used in a combination of two or more types. Furthermore, as described in U.S. Pat. No. 4,123,279, a condensation polymer between formaldehyde and a phenol having as a substituent an alkyl group having 3 to 8 carbons such as a t-butylphenol formaldehyde resin or an octylphenol formaldehyde resin may be used.

(2) With regard to the alkali-soluble polymer compound having a sulfonamide group, there can be cited a polymer compound obtained by homopolymerization of a polymerizable monomer having a sulfonamide group or by copolymerization of the monomer with another polymerizable monomer. With regard to the polymerizable monomer having a sulfonamide group, there can be cited a polymerizable monomer that is a low molecular weight compound having in the molecule one or more polymerizable unsaturated bonds and one or more sulfonamide groups '$—NH—SO_2—$' having a hydrogen atom bonded to the nitrogen atom. Among these, a low molecular weight compound having an acryloyl group, an allyl group, or a vinyloxy group, and having a substituted or mono-substituted aminosulfonyl group or a substituted sulfonylimino group is preferable.

(3) With regard to the alkali-soluble polymer compound having an active imide group, a polymer derived from a monomer having an active imide group in the molecule is preferable, and examples of this polymer compound include a polymer compound obtained by homopolymerization of a polymerizable monomer that is a low molecular weight compound having in the molecule one or more active imide groups and one or more polymerizable unsaturated bonds, or by copolymerization of the monomer with another polymerizable monomer.

Specific examples of such a compound that can be suitably used include N-(p-toluenesulfonyl)methacrylamide and N-(p-toluenesulfonyl)acrylamide.

With regard to the alkali-soluble polymer compound used in the present invention, it is preferable to use a polymer compound obtained by polymerization of two or more types from the polymerizable monomer having a phenolic hydroxyl group, the polymerizable monomer having a sulfonamide group, and the polymerizable monomer having an active imide group, or to use a polymer compound obtained by copolymerization of said two or more types of these polymerizable monomers with another polymerizable monomer. When copolymerizing the polymerizable monomer having a phenolic hydroxyl group with the polymerizable monomer having a sulfonamide group and/or the polymerizable monomer having an active imide group, the ratio by weight of these components added is preferably in the range of 50:50 to 5:95, and particularly preferably in the range of 40:60 to 10:90.

In the present invention, when the alkali-soluble polymer is a copolymer of another polymerizable monomer with the polymerizable monomer having a phenolic hydroxyl group, the polymerizable monomer having a sulfonamide group, or the polymerizable monomer having an active imide group, it is preferable for the monomer imparting alkali solubility to be present at 10 mol % or greater, and preferably at 20 mol % or greater. When the copolymerization component is present at 10 mol % or greater, the alkali solubility increases, and an effect on the development latitude is enhanced.

With regard to the monomer component that is copolymerized with the polymerizable monomer having a phenolic hydroxyl group, the polymerizable monomer having a sulfonamide group, or the polymerizable monomer having an active imide group, compounds listed in (m1) to (m12) below can be cited as examples, but the monomer component is not limited thereto.

(m1) Acrylic esters and methacrylic esters having an aliphatic hydroxyl group, including 2-hydroxyethyl acrylate, 2-hydroxyethyl methacrylate, and the like.

(m2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, and glycidyl acrylate.

(m3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, and glycidyl methacrylate.

(m4) Acrylamides and methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide.

(m5) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(m6) Vinyl esters such as vinyl acetate, vinyl chloroacetate, vinyl butyrate, and vinyl benzoate.

(m7) Styrenes such as styrene, α-methylstyrene, methylstyrenes, and chloromethylstyrenes.

(m8) Vinyl ketones such as methyl vinyl ketone, ethyl vinyl ketone, propyl vinyl ketone, and phenyl vinyl ketone.

(m9) Olefins such as ethylene, propylene, isobutylene, butadiene, and isoprene.

(m10) N-Vinylpyrrolidone, acrylonitrile, and methacrylonitrile, and the like.

(m11) Unsaturated imides such as maleimide, N-acryloylacrylamide, N-acetylmethacrylamide, N-propionylmethacrylamide, and N-(p chlorobenzoyl)methacrylamide.

(m12) Unsaturated carboxylic acids such as acrylic acid, methacrylic acid, maleic anhydride, and itaconic acid.

The alkali-soluble polymeric compounds can be prepared by a known graft copolymerization method, a known block copolymerization method, a known random copolymerization method, and the like.

In the present invention, when the alkali-soluble polymer is a homopolymer or copolymer of the polymerizable monomer having a phenolic hydroxyl group, the polymerizable monomer having a sulfonamide group, or the polymerizable monomer having an active imide group, the weight-average molecular weight of the homopolymer or copolymer is preferably 2,000 or greater, and the number-average molecular weight thereof is preferably 500 or greater. More preferably, the weight-average molecular weight is 5,000 to 300,000, the number-average molecular weight is 800 to 250,000, and dispersity (weight-average molecular weight/number-average molecular weight) is 1.1 to 10.

In the present invention, when the alkali-soluble polymer is a resin such as a phenol formaldehyde resin or a cresol aldehyde resin, its weight-average molecular weight is preferably 500 to 20,000, and its number-average molecular weight is preferably 200 to 10,000.

These alkali-soluble polymer compounds may be used singly or in a combination of two or more types, and the amount thereof added is 30 to 99 wt % of the total solids content of the heat-sensitive layer, preferably 40 to 95 wt %, and particularly preferably 50 to 90 wt %. It is preferable, from the viewpoint of balance between the sensitivity and the durability of the heat-sensitive layer, for the amount of alkali-soluble polymer added to be in any one of the above-mentioned ranges.

Infrared-absorbing Dye (B)

The infrared-absorbing dye used in the heat-sensitive layer of the present invention is not particularly limited as long as it is a dye that absorbs infrared light and generates heat, and various types of known infrared-absorbing dyes can be used.

As the infrared-absorbing dyes relating to the invention, commercially available dyes and known dyes as described in the literature (e.g., “Senryo Binran” (Dye Handbook), edited by The Society of Synthetic Organic Chemistry, Japan, 1970) can be used. Specific examples of such dyes include azo dyes, metal complex azo dyes, pyrazolone azo dyes, anthraquinone dyes, phthalocyanine dyes, carbonium dyes, quinoneimine dyes, methine dyes, cyanine dyes, and the like. Of these dyes, dyes absorbing infrared or near infrared rays are particularly preferable from the viewpoint of use with lasers emitting infrared or near infrared rays.

Examples of the dyes absorbing infrared or near infrared rays include cyanine dyes as described in JP-A-58-125246, JP-A-59-84356, JP-A-59-202829, JP-A-60-78787, and the like, methine dyes as described in JP-A-58-173696, JP-A-58-181690, JP-A-58-194595, and the like, naphthoquinone dyes as described in JP-A-58-112793, JP-A-58-224793, JP-A-5948187, JP-A-59-73996, JP-A-60-52940, JP-A-60-63744, and the like, squarylium dyes as described in JP-A-58-112792 and the like, and cyanine dyes as described in British Patent No. 434,875, and the like.

Furthermore, as the dyes, there can also be appropriately used near infrared-absorbing sensitizers as described in U.S. Pat. No. 5,156,938, substituted arylbenzo(thio)pyrylium salts as described in U.S. Pat. No. 3,881,924, trimethinethiapyrylium salts as described in JP-A-57-142645 (U.S. Pat. No. 4,327,169), pyrylium compounds as described in JP-A-58-181051, JP-A-58-220143, JP-A-59-41363, JP-A-59-84248, JP-A-59-84249, JP-A-59-146063, and JP-A-59-146061, cyanine dyes as described in JP-A-59-216146, pentamethinethiopyrylium salts and the like as described in U.S. Pat. No. 4,283,475, and pyrylium compounds and the like as disclosed in JP-B-5-13514 and JP-B-5-19702 (JP-B denotes a Japanese examined patent application publication), and as commercially available products, Epolight III-178, Epolight III-130, Epolight III-125, and the like manufactured by Epolin Co. are particularly preferably used.

Furthermore, other examples of particularly preferred dyes include near infrared-absorbing dyes denoted by Formulae (I) and (II) as described in U.S. Pat. No. 4,756,993.

The dye may be added to the printing starting plate material at 0.01 to 50 wt % of the total solids content of the heat-sensitive layer, preferably 0.1 to 10 wt %, and particularly preferably 0.5 to 10 wt %. It is preferable, from the viewpoint of the balance between sensitivity and durability, for the amount of dye added to be in any one of the above-mentioned ranges.

Sulfonium Salt (C)

The compound that is Component (C), which is represented by Formula (I), used in the present invention is an arylsulfonium salt having at least one hydroxyl group at an ortho- and/or para-position and having an organic acid as a counter anion. Sulfonium salts generally interact with an alkali-soluble binder resin and exhibit a dissolution inhibition action toward an alkaline developer. However, the arylsulfonium salt having a hydroxyl group at the ortho- and/or para-position, which is Component (C) of the present invention, exhibits an alkali solubility-improving action in exposed areas. Although the mechanism is unclear, it can be surmised that a reaction occurs in which the arylsulfonium salt isomerizes into a quinoide structure when exposed, thus converting it into a neutral molecule and releasing its counter anion as an organic acid. It is thought that this results in an increase in the difference in solubility between exposed and unexposed areas. Specifically, the compounds represented by Formula (I) are useful; many thereof are available as commercial products, but they can generally be synthesized by a Grignard reaction or a Friedel-Crafts reaction between a sulfide compound and an aromatic compound. The counter anion structure can be changed by exchange with an appropriate salt, and various compounds can be synthesized.

(I)

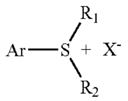

In the formula, $R_1$ and $R_2$ independently denote an optionally substituted alkyl group having 1 to 12 carbons, an optionally substituted cycloalkyl group having 3 to 8 carbons, an optionally substituted aralkyl group having 7 to 12 carbons, or an optionally substituted aryl group having 6 to 15 carbons. $R_1$ and $R_2$ may bond to each other to form a cyclic structure. Ar denotes an optionally substituted aromatic hydrocarbon group having 6 to 15 carbons and having at least one OH group at an ortho- and/or para-position. $X^-$ denotes an anion of an organic acid.

Examples of groups acceptable as $R_1$ and $R_2$ are explained in turn below. The alkyl group is, for example, an alkyl group having 1 to 12 carbons, and specific examples thereof include a methyl group, an ethyl group, a propyl group, an n-butyl group, a sec-butyl group, a hexyl group, a 2-ethylhexyl group, an octyl group, a decanyl group, and a dodecyl group. The cycloalkyl group may be of a monocyclic type or a polycyclic type. The monocyclic type cycloalkyl group is preferably one having 3 to 8 carbons such as a cyclopropyl group, a cyclopentyl group, or a cyclohexyl group. Preferred examples of the polycyclic type cycloalkyl group include an adamantyl group, a norbornyl group, an isobornyl group, a camphanyl group, a dicyclopentyl group, an α-pinyl group, and a tricyclodecanyl group. The aralkyl group is, for example, an aralkyl group having 7 to 12 carbons, and specific examples thereof include a benzyl group, a phenethyl group, and a naphthylmethyl group. The aryl group is, for example, an aryl group having 6 to 15 carbons, and specific examples thereof include a phenyl group, a tolyl group, a dimethylphenyl group, a 2,4,6-trimethylphenyl group, a naphthyl group, an anthryl group, and a 9,10-dimethoxyanthryl group.

With regard to the cyclic structure formed by bonding $R_1$ and $R_2$, an alkylene group can be cited as an example, and an alkylene group having 4 or 5 carbons is preferable.

Ar is an aryl group that has at least one OH group at an ortho- and/or para-position and may have a substituent, and preferred examples thereof include a phenyl group, a tolyl group, a dimethylphenyl group, a naphthyl group, and an anthryl group that have at least one OH group at the ortho- and/or para-position, the groups having 6 to 15 carbons.

$X^-$ is an anion of an organic acid, and examples thereof include anions of acids such as an alkylsulfonic acid, a cycloalkylsulfonic acid, a perfluoroalkylsulfonic acid, an aryl sulfonic acid (for example, benzenesulfonic acid, naphthalenesulfonic acid, and anthracenesulfonic acid, which may have a substituent), an alkylcarboxylic acid, a cycloalkylcarboxylic acid, a perfluoroalkylcarboxylic acid, an arylcarboxylic acid (for example, benzoic acid, naphthylcarboxylic acid, and anthranylcarboxylic acid, which may have a substituent), phosphoric acid, phosphonic acid, an N-sulfonylamide (for example, saccharin), and an N-sulfonylsulfonamide, all of which may have a substituent.

With regard to permissible substituents for $R_1$, $R_2$, or Ar above, there can be cited as examples an alkyl group (having 1 to 8 carbons; for example, a methyl group, an ethyl group, a propyl group, an n-butyl group, a sec-butyl group, a hexyl group, a 2-ethylhexyl group, or an octyl group), a cycloalkyl group (having 3 to 8 carbons; for example, a cyclopropyl group, a cyclopentyl group, or a cyclohexyl group), a haloalkyl group (having 1 to 5 carbons; for example, a fluoromethyl group, a chloromethyl group, a bromomethyl group, a trifluoromethyl group, or a pentafluoroethyl group), an alkoxy group (having 1 to 8 carbons; for example, a methoxy group, an ethoxy group, a propoxy group, a butoxy group, or an octyloxy group), an amide group, a ureido group, a urethane group, a hydroxyl group, a carboxyl group, a halogen atom (a fluorine atom, a chlorine atom, a bromine atom, or an iodine atom), a thioether group, an acyl group (an acetyl group, a propanoyl group, a pivaloyl group, etc.), an acyloxy group (an acetoxy group, a propanoyloxy group, a pivaloyloxy group, etc.), an alkoxycarbonyl group (a methoxycarbonyl group, an ethoxycarbonyl group, a propoxycarbonyl group, etc.), a cyano group, and a nitro group.

Specific examples of the sulfonium salt represented by Formula (I) are shown below, but the present invention is not limited thereto.

(I-1)

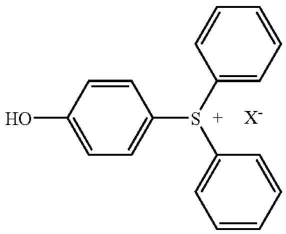

(I-2)

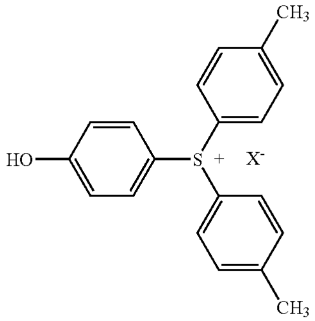

-continued (I-3)

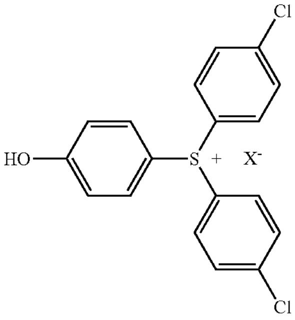

(I-4)

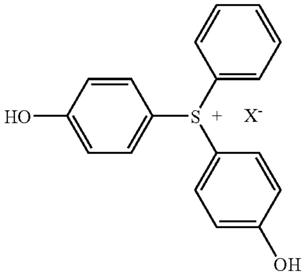

(I-5)

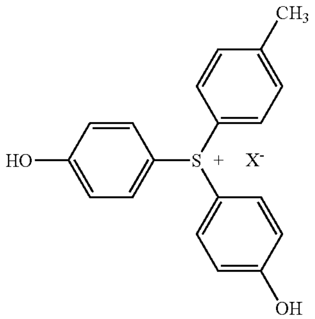

(I-6)

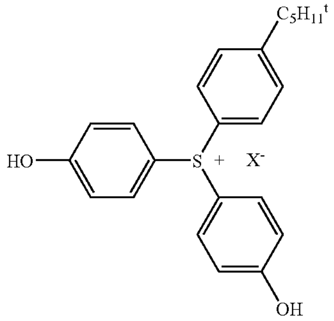

(I-7)

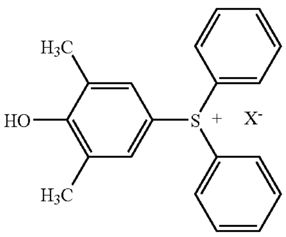

-continued
(I-8)
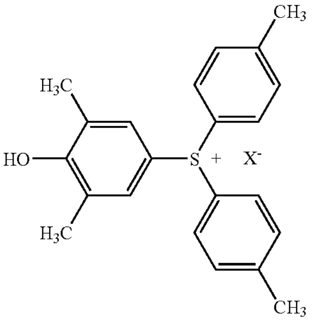
(I-9)
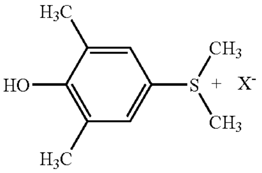
(I-10)
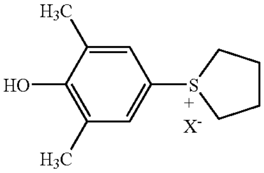
(I-11)
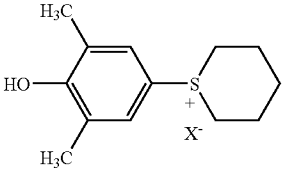
(I-12)
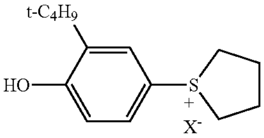
(I-13)
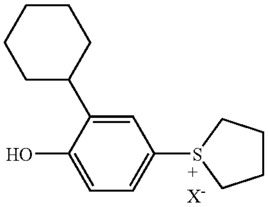
(I-14)
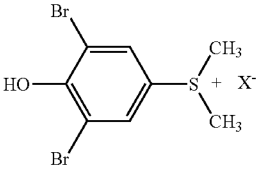
(I-15)
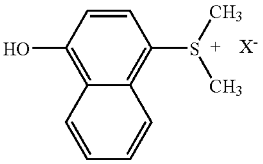
-continued
(I-16)
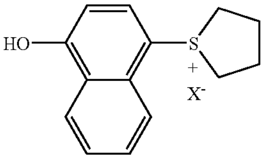
(I-17)
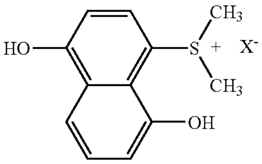
(I-18)
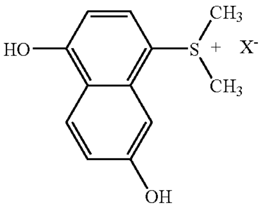
$X^-$ in the specific examples is a counter anion, and denotes one of the structures (a) to (h) below.
(a)
$C_4F_9SO_3^-$
(b)
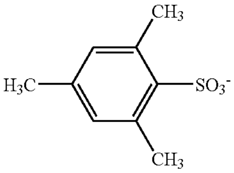
(c)
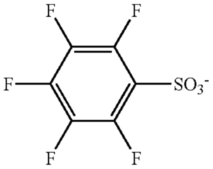
(d)
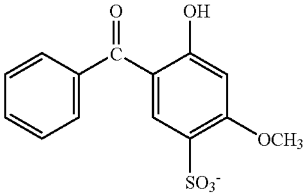
(e)
$C_8F_{17}COO^-$
(f)
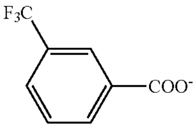
(g)
$CF_3SO_2—N^-—SO_2CF_3$ -continued (h)

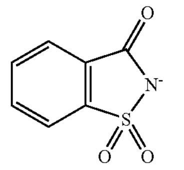

The sulfonium salt (C) used in the present invention may be used singly or in a combination of two or more types, and the amount thereof added is 0.1 to 30 wt % of the total solids content of the heat-sensitive layer, preferably 0.3 to 20 wt %, and more preferably 0.5 to 15 wt %.

Other Components

When forming the positive-working heat-sensitive layer, in addition to the above-mentioned essential components, various additives may be added optionally in such a range that the effects of the present invention are not impaired. Examples of such additives are illustrated below.

For example, joint use of substances such as onium salts, o-quinonediazide compounds, aromatic sulfone compounds, and aromatic solfonic esters which are thermally decomposable but lower substantially the solubility of the alkali-soluble polymeric compounds in an undecomposed state are preferred in view of improvement in capability to impede dissolution of the image areas in the developers. Examples of the onium salts include diazonium salts, ammonium salts, phosphonium salts, iodonium salts, sulfonium salts, selenonium salts, arsonium salts, and the like.

With regard to the onium salts used in the present invention, it is preferable to use diazonium salts as described, for example, in S. I. Schlesinger, Photogr. Sci. Eng., 18, 387 (1974), T. S. Bal, et al., Polymer, 21, 423 (1980), and JP-A-5-158230, ammonium salts as described in U.S. Pat. Nos. 4,069,055 and 4,069,056, and JP-A-3-140140, the phosphonium salts as described in D. C. Necker, et al., Macromolecules, 17, 2468 (1984), C. S. Wen, et al., The, Proc. Conf. Rad. Curing ASIA, p478, Tokyo, October (1988), and U.S. Pat. Nos. 4,069,055 and 4,069,056, the iodonium salts as described in J. V. Crivello, et al., Macromolecules, 10(6), 1307 (1977), Chem. & Eng. News, November 28, p31 (1988), European Patent No. 104,143, U.S. Pat. Nos. 339,049 and 410,201, JP-A-2-150848, and JP-A-2-296514, sulfonium salts as described in J. V. Crivello, et al., Polymer J. 17, 73 (1985), J. V. Crivello, et al., J. Org. Chem., 43, 3055 (1978), W. R. Watt, et al., J. Polymer Sci., Polymer Chem Ed., 22, 1789 (1984), J. V. Crivello, et al., Polymer Bull., 14, 279 (1985), J. V. Crivello, et al., Macromolecules, 14(5), 1141 (1981), J. V. Crivello, et al., J. Polymer Sci., Polymer Chem. Ed., 17, 2877 (1979), European Patent Nos. 370,693, 233,567, 297,443, and 297,442, U.S. Pat. Nos. 4,933,377, 3,902,114, 4,760,013, 4,734,444, and 2,833,827, and German Patent Nos. 2,904,626, 3,604,580, and 3,604,581, the selenonium salts as described in J. V. Crivello, et al., Macromolecules, 10(6), 1307 (1977), J. V. Crivello, et al., J. Polymer Sci., Polymer Chem. Ed., 17, 1047 (1979), the arsonium salts as described in C. S. Wen, et al., Teh, Proc. Conf. Rad. Curing ASIA, p478 Tokyo, October (1988), and the like.

Of these onium salts, the diazonium salts are particularly preferred. Furthermore, there can be cited particularly preferred diazonium salts as described in JP-A-5-158230.

With regard to the counter ions in the onium salts, there can be cited anions from tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoylbenzenesulfonic acid, p-toluenesulfonic acid, and the like. Of these acids, there can be preferably cited alkyl aromatic sulfonic acids such as hexafluorinated phosphoric acid, triisopropylnaphthalenesulfonic acid, and 2,5-dimethylbenzenesulfonic acid.

Suitable quinonediazides include o-quinonediazide compounds. The o-quinonediazides used in the present invention are compounds having at least one o-quinonediazide group and increasing alkali solubility depending upon the thermal decomposition, and such compounds having various structures can be used. That is, the o-quinonediazides have both effects of losing a capability of the binding agent to impede the dissolution and allowing the o-quinonediazides themselves to turn into the alkali-soluble substances by the thermal decomposition, thus promoting the solubility of the sensitive materials. With regard to the o-quinonediazide compounds used in the present invention, it is preferable to use compounds as described, for example, in J. Kosar, "Light-Sensitive Systems" p. 339-352, John Wiley & Sons, Inc., and it is particularly preferable to use the sulfonic esters or sulfonamides of o-quinonediazides allowed to react with various aromatic polyhydroxy compounds or aromatic amino compounds. There can be also preferably used esters of pyrogallol-acetone resins with benzoquinone-(1,2)-diazidesuflonic chloride or naphthoquinone-(1,2)-diazide-5-sulfonic chloride as described in JP-B43-28403 and esters of phenol-formaldehyde resins with benzoquinone-(1,2)-diazidesulfonic chloride or naphthoquinone-(1,2)-diazide-5-sulfonic chloride as described in U.S. Pat. Nos. 3,046,120 and 3,188,210.

Furthermore, there can be also preferably used esters of naphthoquinone-(1,2)-diazide-4-sulfonic chloride with phenol-formaldehyde resins or cresol-formaldehyde resins and esters of naphthoquinone-(1,2)-diazide-4-sulfonic chloride with pyrogallol-acetone resins. Other useful o-quinonediazide compounds are disclosed and known in a number of patents.

The other useful o-quinonediazide compounds are described, for example, in JP-A-47-5303, JP-A-48-63802, JP-A-48-63803, JP-A-48-96575, JP-A-49-38701, JP-A-48-13354, JP-B-41-11222, JP-B-45-9610, JP-B-49-17481, U.S. Pat. Nos. 2,797,213, 3,454,400, 3,544,323, 3,573,917, 3,674,495, and 3,785,825, British Patent Nos. 1,227,602, 1,251,345, 1,267,005, 1,329,888, and 1,330,932, German Patent No. 854,890, and the like.

The amount of the o-quinonediazide compounds added is preferably 1 to 50 wt % of the total solid content of the heat-sensitive layer, more preferably 5 to 30 wt %, and particularly preferably 10 to 30 wt %. These compounds can be used singly or in a combination of several thereof.

The amount of the additives other than the o-quinonediazide compounds added is preferably 1 to 50 wt % of the total solid content of the heat-sensitive layer, more preferably 5 to 30 wt %, and particularly preferably 10 to 30 wt %.

For the purpose of strengthening the discrimination of images and the resistance to scratching of the surfaces, it is preferable to use in a combination of a polymer, which is prepared as a polymerization component from a (meth) acrylate monomer having two or three perfluoroalkyl groups having 3 to 20 carbon atoms in a molecule as described in JP-A-2000-187318. The amount thereof added is preferably 0.1 to 10 wt % of the total solid content of the heat-sensitive layer, and more preferably 0.5 to 5 wt %.

In the heat-sensitive layer of the present invention, a compound for reducing the coefficient of static friction of the surface can be added to impart the resistance to scratching. Specific examples of the compound include alkyl esters of long-chain carboxylic acids as described in U.S. Pat. No. 6,117,913. The amount thereof added is preferably 0.1 to 10 wt % of the total solid content of the heat-sensitive layer, and more preferably 0.5 to 5 wt %.

Furthermore, the heat-sensitive layer of the present invention can contain optionally a low molecular weight compound having an acidic group to promote the solubility. The acidic group includes groups having a pKa value of from 7 to 11 such as a thiol group, a phenolic hydroxyl group, a sulfonamide group, and an active methylene group. In those compounds, the compound having a sulfonamide group is preferred.

The amount thereof added is preferably 0.05 to 5 wt % of the total solid content of the heat-sensitive layer, and more preferably 0.1 to 3 wt %. When the content is in the above-mentioned range, the solubility of the respective layers to increase in a developer can maintain a suitable condition.

Furthermore, in the present invention, various agents for impeding the dissolution of the heat-sensitive layer can be contained in order to control the solubility. Disulfone compounds and sulfone compounds as described in JP-A-11-119418 are suitably used as the agents, and specifically 4,4'-bishydroxyphenylsulfone is preferably used.

The amount thereof added is preferably 0.05 to 20 wt % of the total solid content of the heat-sensitive layer, and more preferably 0.5 to 10 wt %.

For the purpose of improving the sensitivity, cyclic acid anhydrides, phenols, or organic acids can be used in combination. Examples of the cyclic acid anhydrides can be used include phthalic anhydride, tetrahydrophthalic anhydride, hexahydrophthalic anhydride, 3,6-endoxo-$\Delta^4$-tetrahydrophthalic anhydride, tetrachlorophthalic anhydride, maleic anhydride, chloromaleic anhydride, $\alpha$-phenylmaleic anhydride, succinic anhydride, pyrromellitic anhydride, and the like which are described in U.S. Pat. No. 4,115,128.

Examples of the phenols include bisphenol A, p-nitrophenol, p-ethoxyphenol, 2,4,4'-trihydoxybenzophenone, 2,3,4-trihydroxybenzophenone, 4-hydroxybenzophenone, 4,4',4"-trihydroxytriphenylmethane, 4,4', 3", 4"-tetrahydroxy-3,5, 3',5'-tetramethyltriphenylmethane, and the like.

The organic acids include sulfonic acids, sulfinic acids, alkyl sulfates, phosphonic acids, phosphoric esters, carboxylic acids, and the like which are described in JP-A-60-88942 and JP-A-2-96755, specifically p-toluenesulfonic acid, dodecylbenzenesulfonic acid, naphthalenesulfonic acid, p-toluenesulfinic acid, ethyl sulfate, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cylcohexene-1,2-dicarboxylic acid, erucic acid, lauric acid, n-undecanoic acid, ascorbic acid, and the like.

The content of these cyclic acid anhydrides, phenols, or organic acids of the material composing the heat-sensitive layer is preferably 0.05 to 20 wt %, more preferably 0.1 to 15 wt %, and particularly preferably 0.1 to 10 wt %.

For the purpose of enhancing the stability to the treatment of development, the heat-sensitive layer of the present invention can contain non-ionic surfactants as described in JP-A-62-251740 and JP-A-3-208514, ampholytic surfactants as described in JP-A-59-121044 and JP-A-4-13149, siloxane compounds as described in European Patent No. 950,517, and copolymers prepared from fluorine-containing monomers as described in JP-A-11-288093.

Specific examples of the non-ionic surfactants include sorbitan tristearate, sorbitan monopalmitate, sorbitan trioleate, monoglyceride stearate, polyoxyethylene nonylphenyl ether, and the like. Specific examples of the ampholytic surfactants include alkyldi(aminoethyl)glycine, alkylpolyaminoethylglycine hydrochloride, 2-alkyl-N-carboxyethyl-N-hydroxyethylimidazolium betaine, and N-tetradecyl-N,N-betaines (e.g., "Amorgen K" (trade name) manufactured by Dai-ichi Kogyo Seiyaku Co., Ltd.).

Preferred examples of the siloxane compounds are block copolymers of dimethylsiloxane and polyalkylene oxides, specifically including polyalkylene oxide-modified silicones such as DBE-224, DBE-621, DBE-712, DBP-732, and DBP-534 manufactured by Chisso K. K. and Tego Glide 100 manufactured by Tego Co. (Germany).

The amount of the above-mentioned surfactants added is preferably 0.05 to 15 wt % of the total solid content of the heat-sensitive layer, and more preferably 0.1 to 5 wt %.

The heat-sensitive layer of the present invention can contain dyes and pigments as printing-out agents or image colorants to form a visible image immediately after heating depending upon exposure to a ray.

With regard to the printing-out agents, there can be cited as examples a combination of a compound emitting an acid by heating depending upon the exposure to a ray (photo-acid generator) and a salt-formable organic dye. Specific examples of the agents include combinations of o-naphthoquinonediazide-4-sulfonic halogenides and salt-formable organic dyes as described in JP-A-50-36209 and JP-A-53-8128 and combinations of trihalomethyl compounds and salt-formable organic dyes as described in JP-A-53-36223, JP-A-54-74728, JP-A-60-3626, JP-A-61-143748, JP-A-61-151644, and JP-A-63-58440. Such trihalomethyl compounds include oxazole compounds and triazine compounds, which have excellent aging stability and give clear printed-out images, respectively.

With regard to the image colorants, other dyes than the aforesaid salt-formable organic dyes also can be used. Suitable dyes are oil-soluble dyes and basic dyes as well as the salt-formable organic dyes.

Specific examples of the image colorants include Oil Yellow #101, Oil Yellow #103, Oil Pink #312, Oil Green BG, Oil Blue BOS, Oil Blue #603, Oil Black BY, Oil Black BS, Oil Black T-505 (The above dyes are manufactured by Orient Kagaku Kogyo K. K.), Victoria Pure Blue, Crystal Violet (CI42555), Methyl Violet (CI42535), Ethyl Violet, Rhodamine B (CI145170B), Malachite Green (CI42000), Methylene Blue CI52015), and the like. Moreover, dyes as described in JP-A-62-293247 are particularly preferred.

The amount of these dyes added to a printing plate material is 0.01 to 10 wt % of the total solid content of the heat-sensitive layer, and preferably 0.1 to 3 wt %

Plasticizers are added optionally to a printing plate material of the present invention to impart a coat flexibility and others. Examples of the plasticizers used include butylphthalyl polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

1-2. Lower layer

The lithographic printing starting plate of the present invention is preferably provided with a lower layer between the heat-sensitive layer and the support having a hydrophilic surface.

Alkali-soluble Resin

In the present invention, the water-insoluble and alkali-soluble resin (hereinafter called, as for the upper layer, an 'alkali-soluble polymer' as appropriate) used in the lower layer may be one cited for the heat-sensitive layer above. From the viewpoint of image formation during development it is preferable to use an acrylic resin having an acidic group in order to maintain good solubility of the lower layer in the alkaline developer. With regard to the acidic group, those having a pKa value of 5 to 11, such as a phenolic hydroxyl group, a sulfonamide group, an imide group, a carboxyl group, and an active methylene group can be used, and those having a sulfonamide group are particularly preferable from the viewpoint of developability, film strength, film formation properties, etc.

With regard to the acrylic resin having an acidic group, there can be cited polymer compounds obtained by homopolymerization of a polymerizable monomer having an acidic group (specifically, an acrylic or methacrylic monomer) or by copolymerization of the monomer with another polymerizable monomer. It is preferable to use the polymerizable monomer having a phenolic hydroxyl group, a sulfonamide group, or an imide group that is used for the heat-sensitive layer. With regard to the monomer component used in the copolymerization, the compounds shown in the above-mentioned (m1) to (m12) can be cited as examples, but the monomer component is not limited thereto.

In the present invention, when a copolymer of a monomer having an acidic group with another polymerizable monomer is used, it is preferable for the monomer having an acidic group to be present at 10 mol % or greater, and more preferably at 20 mol % or greater. When the copolymer component is present at 10 mol % or greater, the alkali solubility increases, and an effect on the development latitude is enhanced.

In the present invention, when the alkali-soluble polymer of the lower layer is a homopolymer or copolymer of the polymerizable monomer having an acidic group, it is preferable to use one having a weight-average molecular weight of 2,000 or greater and a number-average molecular weight of 500 or greater. It is more preferable to use one having a weight-average molecular weight of 5,000 to 300,000, a number-average molecular weight of 800 to 250,000, and a dispersity (weight-average molecular weight/number-average molecular weight) of 1.1 to 10.

These alkali-soluble polymer compounds may be used singly or in a combination of two or more types, and the amount thereof added is 50 to 99 wt % of the total solids content of the lower layer, preferably 60 to 97 wt %, and particularly preferably 70 to 95 wt %. It is preferable, from the viewpoint of balance between the sensitivity and the durability of the heat-sensitive layer, for the amount of alkali-soluble polymer added to be in any one of the above-mentioned ranges.

Infrared-absorbing Dye

In the present invention, in order to prevent overdevelopment (the phenomenon of side etching) of the lower layer, it is possible to add an infrared-absorbing dye not only to the heat-sensitive layer, which is the upper layer, but also to the lower layer. Adding the infrared-absorbing dye to the lower layer enables heat sensitivity to be imparted to the lower layer. In order to prevent underdevelopment, it is necessary for the amount thereof added to be less than that for the upper, heat-sensitive layer. With regard to the infrared-absorbing dye, those used for the upper layer can be used. When the infrared-absorbing dye is added to the lower layer, the same dye as that used for the upper, heat-sensitive layer may be used, or a different one may be used.

The amount thereof added is 0 to 30 wt % of the total solids content of the lower layer, preferably 0.1 to 10 wt %, and more preferably 0.5 to 7 wt %. It is preferable, from the viewpoint of the balance between sensitivity and durability, for the amount of infrared-absorbing dye added to be in any one of the above-mentioned ranges.

Sulfonium Salt (C)

In the present invention, for the purpose of enhancing the sensitivity and the development latitude in exposed areas of the lower layer, the sulfonium salt (C) of Formula (I) may be added not only to the upper, heat-sensitive layer, but also to the lower layer. When this compound is added to the lower layer, the same compound as that used for the upper, heat-sensitive layer may be used, or a different one may be used.

The amount thereof added is 0 to 30 wt % of the total solids content of the lower layer, preferably 0.3 to 20 wt %, and more preferably 0.5 to 15 wt %. When the amount thereof added is in any one of the above-mentioned ranges, the uniformity of the lower layer film can be maintained, the durability improves, and the side etching phenomenon due to overdevelopment can be prevented.

Other Components

When forming the lower layer of the present invention, in addition to the above-mentioned components, various additives may be added optionally in such a range that the effects of the present invention are not impaired. As additives, those cited for the upper, heat-sensitive layer may be used in order to achieve the same object. With regard to preferred additives, there can be cited as examples those that suppress alkali developability of the lower layer such as, for example, the above-mentioned onium salts, o-quinonediazide compounds, aromatic sulfone compounds, and aromatic sulfonic acid ester compounds, and those that promote developability such as low molecular weight compounds having an acidic group with a pKa of 7 to 11, cyclic acid anhydrides, phenols, and organic acids.

It is also preferable to add a dye or a pigment as a printing out agent or an image colorant in order to obtain a visible image immediately after heating by exposure.

The heat-sensitive layer (upper layer) and the lower layer of the lithographic printing starting plate of the present invention can usually be formed by coating a support having a hydrophilic surface with a solution of the above-mentioned components in a solvent. When the lithographic printing starting plate is provided with the lower layer, the support having a hydrophilic surface is generally coated with the lower layer and dried, and subsequently coated with the heat-sensitive layer and dried. Other than this method in which the lower layer and the upper layer (heat-sensitive layer) are provided by coating in sequence, it is also possible to apply the lower layer and the upper layer (heat-sensitive layer) by simultaneous multilayer coating. However, the present invention is not limited to these methods and another method may be employed.

Examples of the solvent used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy- 2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, and toluene, but the examples are not limited thereto. These solvents may be used singly or in combination.

When the lithographic printing starting plate is provided with the lower layer, the solvent used for coating is preferably selected so that there is a difference in solubility therein between the alkali-soluble polymer used in the heat-sensitive layer and the alkali-soluble polymer used in the lower layer. That is, after applying the lower layer, when applying the upper, heat-sensitive layer so as to be adjacent to the lower layer, if a solvent that can dissolve the alkali-soluble polymer of the lower layer is used as a coating solvent for the uppermost layer, mixing at the interface therebetween might occur at a considerable level, and in extreme cases a uniform single layer might be produced instead of multiple layers. When mixing at the interface between two adjacent layers occurs or they dissolve in each other and behave as a uniform layer in this way, the effect of the present invention obtained by providing two layers might be impaired, which is undesirable. Because of this, the solvent used for coating the upper, heat-sensitive layer is desirably a poor solvent for the alkali-soluble polymer contained in the lower layer.

The concentration of the above-mentioned components (total solids content including the additives) in the solvent for applying each layer is preferably 1 to 50 wt %.

Although the coat weight (solids content) of the heat-sensitive layer on the support obtained after coating and drying varies according to the intended use, in the case of the lithographic printing starting plate having the heat-sensitive layer on the support having a hydrophilic surface, the coat weight of the heat-sensitive layer is preferably 0.5 to 3.0 $g/m^2$, and more preferably 0.8 to 2.0 $g/m^2$.

In the case of the lithographic printing starting plate having the lower layer provided between the heat-sensitive layer and the support having a hydrophilic surface, the coat weight of the heat-sensitive layer is preferably 0.05 to 1.0 $g/m^2$, and the coat weight of the lower layer is preferably 0.3 to 3.0 $g/m^2$.

It is preferable, from the viewpoint of the balance between image formation properties and sensitivity, for the coat weight of the heat-sensitive layer to be in the above-mentioned range. When the coat weight of the lower layer is in the above-mentioned range, the image formation properties improve. When the lithographic printing starting plate is provided with the upper layer and the lower layer, the total coat weight of the two layers is preferably 0.5 to 3.0 $g/m^2$, and it is preferable, from the viewpoint of the balance between film properties and sensitivity, for the coat weight to be in the above-mentioned range.

With regard to the coating method, various methods can be employed, and examples thereof include a bar coating method, a rotary coating method, a spray coating method, a curtain coating method, a dip coating method, an air-knife coating method, a blade coating method, and a roll coating method.

It is possible to add to the lower layer or the heat-sensitive layer of the present invention a surfactant for improving the coating properties, for example, a fluorine-based surfactant such as those described in JP-A-62-170950. The amount thereof added is preferably 0.01 to 1 wt % of the total solids content of the lower layer or the heat-sensitive layer, and more preferably 0.05 to 0.5 wt %.

1-3. Support Having Hydrophilic Surface

With regard to the support used for the lithographic printing starting plate of the present invention, a sheet-form material that has a hydrophilic surface, required strength and durability, and is dimensionally stable can be cited, and the sheet-form material is preferably flexible. Examples of such a support include paper, paper laminated with a plastic (for example, polyethylene, polypropylene, or polystyrene), a metal sheet (for example, aluminum, zinc, or copper), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, or polyvinyl acetal), paper laminated with the above-mentioned metal or having the above-mentioned metal vapor-deposited thereon, and a plastic film. A hydrophobic plastic is, prior to use, subjected to an appropriate treatment, such as hydrophilizing the surface, providing a hydrophilic coating layer, etc.

With regard to the support of the present invention, polyester film and aluminum sheet are preferable, and aluminum sheet is particularly preferable thereamong because of its good dimensional stability and relatively low cost. Preferred examples of the aluminum sheet include a pure aluminum sheet and an alloy sheet containing aluminum as a main component and also containing a small amount of another element, and it is also possible to use a plastic film laminated with aluminum or having aluminum vapor-deposited thereon. Examples of the other element contained in the aluminum alloy include silicon, iron, manganese, copper, magnesium, chromium, zinc, bismuth, nickel, and titanium. The content of the other element in the alloy is 10 wt % or less. A particularly preferred aluminum in the present invention is pure aluminum, and since it is difficult to produce completely pure aluminum from the standpoint of refinery technology, a trace amount of another element may be present.

As described above, the composition of the aluminum sheet employed in the present invention is not specified, and an aluminum sheet known in the art as a material can be used as appropriate. The thickness of the aluminum sheet used in the present invention is approximately 0.1 to 0.6 mm, preferably 0.15 to 0.4 mm, and particularly preferably 0.2 to 0.3 mm.

Prior to roughening the surface of the aluminum sheet, if desired, a degreasing treatment with, for example, a surfactant, an organic solvent, or an aqueous alkaline solution is carried out in order to remove a rolling oil from the surface. The roughening treatment of the surface of the aluminum sheet may be carried out by various methods such as, for example, a method involving mechanical roughening, a method involving electrochemical dissolution-roughening of the surface, and a method involving selective chemical dissolution of the surface. With regard to the mechanical method, a known method can be employed such as a ball grinding method, a brush grinding method, a blast grinding method, or a buff grinding method. With regard to the electrochemical roughening method, there is a method in which alternating current or direct current is used in a hydrochloric acid or nitric acid electrolytic solution. As disclosed in JP-A-54-63902, a method in which the two are combined can also be employed. The aluminum sheet whose surface has been thus roughened is subjected to an alkali etching treatment and a neutralization treatment optionally and then, if desired, to an anodizing treatment in order to improve the water retention and the abrasion resistance of the surface. With regard to the electrolyte used for the anodizing treatment of the aluminum sheet, various electrolytes for forming a porous oxide coating can be used and, in general, sulfuric acid, phosphoric acid, oxalic acid, chromic acid, or a mixture of these acids is used. The concentration of the electrolyte is determined according to the type of electrolyte as appropriate.

The conditions for the anodizing treatment depend on the type of electrolyte used and cannot, as a rule, be fixed but, in general, an electrolyte solution concentration of 1 to 80 wt %, a solution temperature of 5 to 70° C., a current density of 5 to 60 A/dm2, a voltage of 1 to 100 V, and an electrolysis time of 10 sec to 5 min are appropriate. When the amount of anodized coating is 1.0 g/$m^2$ or greater, the plate life is sufficient, the non-image areas of the lithographic printing plate become resistant to scratching, and the so-called 'scratch staining', which is caused by ink becoming attached to scratched areas during printing, hardly occurs. After being subjected to the anodizing treatment, the surface of the aluminum is subjected optionally to a treatment to hydrophilize the surface. With regard to the hydrophilization treatment employed in the present invention, there are methods employing an alkali metal silicate (for example, an aqueous solution of sodium silicate) as disclosed in U.S. Pat. Nos. 2,714,066, 3,181,461, 3,280,734, and 3,902,734. In these methods, the support is immersed in an aqueous solution of sodium silicate or subjected to electrolysis. It is also possible to employ a method involving treatment with potassium fluorozirconate as disclosed in JP-B-36-22063, or with polyvinylphosphonic acid as disclosed in U.S. Pat. Nos. 3,276,868, 4,153,461, and 4,689,272.

1-4. Layer Arrangement and Other Additives

The lithographic printing starting plate of the present invention has, on a support having a hydrophilic surface, a positive-working heat-sensitive layer, and preferably has, on the support having a hydrophilic surface, one or more lower layers and one or more positive-working heat-sensitive layers, the two layers being provided in this order in terms of their spatial arrangement, but it is also possible to provide optionally an undercoat layer between the support having a hydrophilic surface and the lower layer.

The components of the undercoat layer include various organic compounds, examples of the organic compounds used include carboxymethyl cellulose, dextrin, gum arabic, phosphonic acids having an amino group such as 2-aminoethylphosphonic acid, organic phosphonic acids such as phenylphosphonic acid, naphthylphosphonic acid, alkylphosphonic acid, glycerophosphonic acid, methylenediphosphonic acid, and ethylenediphosphonic acid which may have a substituent group, organic phosphoric acids such as phenylphosphoric acid, naphthylphosphoric acid, alkylphosphoric acid, and glycerophosphoric acid which may have a substituent group, organic phosphinic acids such as phenylphosphinic acid, naphthylphosphinic acid, alkylphosphinic acid, and glycerophosphinic acid which may have a substituent group, amino acids such as glycine and β-alanine, hydrochlorides of amines having a hydroxy group such as triethanolamine hydrochloride, and the like. These organic compounds can be used as mixtures thereof.

The organic undercoats can be provided according to the following procedures. That is, the aforesaid organic compounds are dissolved in water, organic solvents such as methanol, ethanol, or methyl ethyl ketone, or mixtures thereof to prepare solutions, and an aluminum sheet is coated with the solutions and dried to provide the organic undercoat, or as another procedure, an aluminum sheet is dipped in the solutions prepared by dissolving the organic compounds in water, organic solvents such as methanol, ethanol, or methyl ethyl ketone, or mixtures thereof to allow the organic compounds to adsorb, washed with water, and then dried to provide an organic undercoat.

In the former procedure, the solution of the organic compounds having a concentration of 0.005 to 10 wt % can be coated by various methods. In the latter procedure, the concentration of the solution is 0.01 to 20 wt % and preferably 0.05 to 5 wt %, the temperature of the dipping is 20 to 90° C. and preferably 25 to 50° C., and the time of the dipping is 0.1 sec to 20 min and preferably 2 sec to 1 min.

The solutions used herein also can be adjusted to pH 1 to 12 by use of basic substances such as ammonia, triethylamine, and potassium hydroxide, and acidic substances such as hydrochloric acid and phosphoric acid. Yellow dyes also can be added to the solutions to improve the tone reproducibility of an image recording material.

The amount of the coated weight of the organic undercoat is suitably 2 to 200 mg/$m^2$ and preferably from 5 to 100 mg/$m^2$. The above-mentioned range is selected from a viewpoint of press life.

Alkali Developers

For the lithographic printing starting plate of the present invention, developers containing (a) at least one sugar selected from non-reducing sugars and (b) at least one base and having a pH falling in the range of 9.0 to 13.5 are preferably used. The developers are illustrated in detail below. In the present specification, the developers mean development-initiating solutions (developers in a narrow sense) and replenishers unless otherwise noted.

It is preferable that the developers comprise as main components at least one compound selected from the non-reducing sugars and at least one base and the pH of the developers is in the range of from 9.0 to 13.5. The non-reducing sugars are those having no free aldehyde group or ketone group and showing no reducing properties and are classified into trehalose-type oligosaccharides where reducible groups link together, glycosides where reducing groups of the sugar link with non-sugars, and sugar alcohols formed by reduction of sugars by hydrogenation. All of these non-reducing sugars can be preferably used. The trehalose-type oligosaccharides include saccharose and trehalose, and the glycosides include alkyl glycosides, phenolic glycosides, mustard oil glycosides, and the like. The sugar alcohols include D, L-arabitol, ribitol, xylitol, D, L-sorbitol, D, L-mannitol, D, L-iditol, D, L-talitol, dulcitol, allodulcitol, and the like. Furthermore, maltitol prepared by hydrogenation of disaccharides and reductants (reduced starch syrups) prepared by hydrogenation of the oligosaccharides are preferably used. Of these, particularly preferred non-reducing sugars are the sugar alcohols and saccharose, and particularly D-sorbitol, saccharose, and reduced starch syrups are preferred because these non-reducing sugars have the buffer action in an appropriate pH range and are available at a low cost.

These non-reducing sugars can be used singly or as mixtures of two or more thereof, and the content thereof is preferably 0.1 to 30 wt % in the developers and more preferably 1 to 20 wt %. It is preferable from a viewpoint of the buffer action and the stability for time that the content is in one of the above-mentioned ranges.

Alkali agents known so far can be used as the bases combined with the non-reducing sugars. Examples of the alkali agents include inorganic agents such as sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate, and ammonium borate. Furthermore, organic alkali agents also are used, including monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and the like.

These alkali agents are used singly or in a combination of two or more thereof. Of these agents, sodium hydroxide and potassium hydroxide are preferred. The reason for this is that pH adjustment can be carried out in a broader pH range by adjusting the amount of the agents to the non-reducing agents. Furthermore, trisodium phosphate, tripotassium phosphate, sodium carbonate, and potassium carbonate are preferred because these salts themselves have the buffer action.

These alkali agents are added to the developers so that the pH thereof falls in the range of 9.0 to 13.5. Although the amount of the agents added is determined depending upon the desired pH and the kind and amount of the non-reducing agents used, the pH range of 10.0 to 13.2 is more preferred.

For the developers, furthermore, alkaline buffer solutions consisting of weak acids other than the sugars and strong bases can be used in combination. The weak acids used for the buffer solutions preferably have a dissociation constant (pKa) of 10.0 to 13.2.

Such weak acids can be selected from those described in "Ionization Constants of Organic Acids in Aqueous Solution", published by Pergamon Press. Examples of the weak acids include alcohols such as 2,2,3,3-tetrafluoropropanol-1 (pKa 12.74), trifluoroethanol (pKa 12.37), and trichloroethanol (pKa 12.24), aldehydes such as pyridine-2-aldehyde (pKa 12.68), and pyridine-4-aldehyde (pKa 12.05), phenolic hydroxy group-containing compounds such as salicylic acid (pKa 13.0), 3-hydroxy-2-naphthoic acid (pKa 12.84), catechol (pKa 12.6), gallic acid (pKa 12.4), sulfosalicylic acid (pKa 11.7), 3,4-dihydroxysulfonic acid (pKa 12.2), 3,4-dihydroxybenzoic acid (pKa 11.94), 1,2,4-trihydroxybenzene (pKa 11.82), hydroquinone (pKa 11.56), pyrogallol (pKa 11.34), o-cresol (pKa 10.33), resorcinol (pKa 11.27), p-cresol (pKa 10.27), and m-cresol (pKa 10.09), oximes such as 2-butanone oxime (pKa 12.45), acetoxime (pKa 12.42), 1,2-cycloheptanedione dioxime (pKa 12.3), 2-hydroxybenzaldehyde oxime (pKa 12.10), dimethylglyoxime (pKa 11.9), ethanediamide dioxime (pKa 11.37), and acetophenone oxime (pKa 11.35), related substances of nucleic acid such as adenosine (pKa 12.56), inosine (pKa 12.5), guanine (pKa 12.3), cytosine (pKa 12.2), hypoxanthine (pKa 12.1), and xanthine (pKa 11.9), and furthermore, diethylaminomethylphosphonic acid (pKa 12.32), 1-amino-3,3,3-trifluorobenzoic acid (pKa 12.29), isopropylidenephosphonic acid (pKa 12.10), 1,1-ethylidenediphosphonic acid (pKa 11.54), 1,1-ethylidenediphosphonic acid 1-hyroxy (pKa 11.52), benzimidazole (pKa 12.86), thiobenzamide (pKa 12.8), picolinic thioamide (pKa 12.55), and barbituric acid (pKa 12.5).

Of these weak acids, sulfosalicylic acid and salicylic acid are preferred. With regard to the bases combined with these weak acids, sodium hydroxide, ammonium hydroxide, potassium hydroxide, and lithium hydroxide are preferably used. These alkali agents can be used singly or in a combination of two or more thereof. The pH is adjusted to a desired range by the concentration of the respective alkali agents and combination thereof with the weak acids.

Various surfactants and organic solvents can be added to the developers optionally for the purpose of promoting the development, dispersing a developer scum, and heightening ink receptivity of the image areas. Preferred surfactants are anionic, cationic, non-ionic, and ampholytic surfactants.

Preferred examples of the surfactants include the nonionic surfactants such as polyoxyethylene alkyl ethers, polyoxyethylene alkylphenyl ethers, polyoxyethylene polystyrylphenyl ethers, polyoxyethylene polyoxypropylenealkyl ethers, glycerin fatty acid partial esters, sorbitan fatty acid partial esters, pentaerythritol fatty acid partial esters, propylene glycol fatty acid monoesters, saccharose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylene-linked castor oils, polyoxyethylene glycerin fatty acid partial esters, fatty acid diethanolamides, N,N-bis-2-hydroxyalkylamines, polyoxyethylenealkylamines, triethanolamine fatty acid esters, and trialkylamine oxides, the anionic surfactants such as fatty salts, abietic salts, hydroxyalkanesulfonic salts, alkanesulfonic salts, dialkylsulfosuccinic ester salts, straight chain alkylbenzenesulfonic salts, branched chain alkylbenzenesulfonic salts, alkylnaphthalenesufonic salts, alkylphenoxypolyoxyethylene propylsulfonic salts, polyoxyethylene alkylsulfophenyl ether salts, N-methyl-N-oleyltaurine sodium salt, N-alkylsulfosuccinic monoamide disodium salt, petroleum sulfonic salts, sulfated tallow oil, sulfuric ester salts of fatty alkyl esters, sulfuric alkyl ester salts, polyoxyethylene alkyl ether sulfuric ester salts, fatty monoglyceride sulfuric ester salts, polyoxyethylene alkylphenyl ether sulfuric ester salts, polyoxyethylene styrylphenyl ether sulfuric ester salts, alkyl phosphoric ester salts, polyoxyethylene alkyl ether phosphoric ester salts, polyoxyethylene alkylphenyl ether phosphoric ester salts, partially saponified products of styrene/maleic anhydride copolymers, partially saponified products of olefin/maleic anhydride copolymers, and formalin-condensed naphthalenesulfonic salts, the cationic surfactants such as alkylamine salts, quaternary ammonium salts such as tetrabutylammonium bromide, polyoxyethylene alkylamine salts, and polyethylene polyamine derivatives, and the ampholytic surfactants such as carboxybetaines, amino carboxylic acids, sulfobetaines, amino sulfuric esters, and imidazolines.

The polyoxyethylene as described above as to the surfactants means polyoxyalkylene such as polyoxymethylene, polyoxypropylene, or polyoxybutylene. The names of such surfactants also should be read in such a way.

Further preferred surfactants are fluorine-based surfactants containing a perfluoroalkyl group in a molecule. Examples of the fluorine-based surfactants include anionic type surfactants such as perfluoroalkylcarboxylic salts, perfluoroalkylsufonic salts, and perfluoroalkylphosphoric salts, ampholytic type surfactants such as perfluoroalkylbetaines, cationic type surfactants such as perfluoroalkyltrimethylammonium salts, and non-ionic type surfactants such as perfluoroalkylamine oxides, perfluoroalkylethylene oxide adducts, oligomers containing perfluoroalkyl groups and hydrophilic groups, oligomers containing perfluoroalkyl groups and lipophilic groups, oligomers containing perfluoroalkyl groups, hydrophilic groups, and lipophilic groups, and urethanes containing perfluoroalkyl groups and lipophilic groups.

The above-mentioned surfactants can be used singly or in a combination of two or more thereof, and the amount thereof added to the developers is preferably 0.001 to 10 wt %, and more preferably 0.01 to 5 wt %.

A variety of development stabilizers can be used for the developers. Preferred examples of the stabilizers include polyethylene glycol adducts of sugar alcohols as described in JP-A-6-282079, tetraalkylammonium compounds such as tetrabutylammonium hydroxide, phosphonium salts such as tetrabutylphosphonium bromide, and iodonium salts such as diphenyliodonium chloride. Furthermore, the examples include anionic and ampholytic surfactants as described in JP-A-50-51324, water-soluble cationic polymers as described in JP-A-55-95946, and water-soluble ampholytic polymeric electrolytes as described in JP-A-56-142528.

Furthermore, the examples include organic boron compounds to which alkylene glycols are added as described in JP-A-59-84241, polyoxyethylene/polyoxypropylene block polymerization type water-soluble surfactants as described in JP-A-60-111246, alkylenediamine compounds having polyoxyethylene/polypropylene substituted as described in JP-A-60-129750, polyethylene glycol having a weight average molecular weight of 300 or more as described in JP-A-61-215554, fluorine-based surfactants having a cationic group as described in JP-A-63-175858, water-soluble ethylene oxide adduct compounds prepared by adding 4 or more moles of ethylene oxide to acid or alcohol as described in JP-A-2-39157, water-soluble polyalkylene compounds, and the like.

Furthermore, organic solvents can be added to the developers optionally. The organic solvents are selected from the solvents having a water solubility of about 10 wt % or less, preferably 5 wt % or less. Examples of the solvents include 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 3-methylcyclohexanol and 4-methylcyclohexanol, N-phenylethanolamine, N-phenyldiethanolamine, and the like.

The amount of the organic solvents is 0.1 to 5 wt % in the total mass content of the developers in use. The amount have a close relation to the amount of the surfactants, and it is preferable that the amount of the surfactants is increased as the amount of the organic solvents is increased. The reason for this is that the organic solvents to dissolve completely and to ensure good development performance.

Moreover, reducing agents can be added to the developers to prevent the printing plate from scumming. Preferred organic reducing agents include phenolic compounds such as thiosalicylic acid, hydroquinone, Metol, methoxyquinone, resorcin, and 2-methylresorcin and amine compounds such as phenylenediamine and phenylhydrazine. Further preferred inorganic reducing agents include the salts of inorganic acids such as sodium salts, potassium salts, and ammonium salts of sulfite, hydrogensulfite, phosphite, hydrogenphosphite, dihydrogenphosphite, thiosulfate, dithionite, and the like.

Of these reducing agents, those having a particularly excellent effect on the prevention of scumming are sulfites. The amount of these reducing agents is 0.05 to 5 wt % in the content of the developers in.

Organic carboxylic acids also can be further added to the developers. Preferred carboxylic acids are aliphatic carboxylic acids having 6 to 20 carbon atoms and aromatic carboxylic acids. Specific examples of the aliphatic carboxylic acids include caproic acid, enanthylic acid, capric acid, lauric acid, myristic acid, palmitic acid, stearic acid, and the like, and particularly preferred ones are alkanoic acids having 8 to 12 carbon atoms. Unsaturated aliphatic acids having a double bond in a carbon chain and aliphatic acids having a branched chain also can be used. The aromatic carboxylic acids are compounds having a carboxylic group substituted on a benzene ring, a naphthalene ring, an anthracene ring, and the like, and specific examples thereof include o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid, 2-naphthoic acid, and the like. The hydroxynaphthoic acids are particularly effective.

It is preferable to use the above-mentioned aliphatic and aromatic carboxylic acids as sodium salts, potassium salts, or ammonium salts in order to increase the solubility in water. Although the content of the organic carboxylic acids in the developers of the present invention is not particularly limited, the content of the acids is 0.1 to 10 wt % in the content of the developers in use, and more preferably 0.5 to 4 wt %. When the content is in the above-mentioned range, the effect to increase the solubility in water is sufficient, and the dissolution of other additives used together is not disturbed.

The developers can further contain optionally antiseptic agents, colorants, thickeners, anti-foaming agents, water softeners, and the like. Examples of the water softeners include polyphosphoric acid, and the sodium salts, potassium salts, and ammonium salts thereof; aminopolycarboxylic acids such as ethylenediaminetetraacetic acid, diethylene-triaminepentaacetic acid, triethylenetetraminehexaacetic acid, hydroxyethylethylenediaminetriacetic acid, nitrilotriacetic acid, 1,2-diaminocyclohexanetetraacetic acid, and 1,3-diamino-2-propanoltetraacetic acid, and the sodium salts, potassium salts, and ammonium salts thereof, and aminotri(methylenephosphonic acid), ethylenediaminetetra(methylenephosphonic acid), diethylenetriaminepenta(methylenephosphonic acid), triethylenetetraminehexa(methylenephosphonic acid), hydroxydiethylethylenediaminetri(methylenephosphonic acid), 1-hydroxyethane-1,1-disulfonic acid, and the sodium salts, potassium salts, and ammonium salts thereof.

Although the most suitable content of such water softeners varies depending upon chelation and the hardness and the amount of water, the content thereof in the developers in use in general is in the range of 0.01 to 5 wt % and more preferably 0.01 to 0.5 wt %. When the content is in the above-mentioned range, the desired purpose is attained, and a bad effect on the image areas in color discharge is disturbed. A residual component of the developers is water. It is profitable for the transportation of the developers to prepare the concentrated solutions thereof where the amount of water is decreased as compared with the developers in use and to dilute the concentrated solutions with water prior to the use of the developers. It is appropriate in this case to concentrate the developers to an extent that each components contained therein are not separated or deposited.

With regard to the developers of the lithographic printing starting plate of the present invention, there can be used to add silicate compounds as the compounds exerting the buffer action in a suitable pH range in place of the above-mentioned reducing sugars. Specifically, mixtures of silicon oxide $SiO_2$ as a silicate component and an alkali oxide $M_2O$ (M denotes an alkali metal) as an alkali component can be added. The ratio of $SiO_2$ to $M_2O$ can be easily controlled in the most suitable range by the adjustment of the concentrations. These silicate salts act as hydrophilic components for substrates.

The molar ratio of silicon oxide to an alkali oxide ($SiO_2$/$M_2O$) is preferably in the range of 0.75 to 4.0, more preferably 0.75 to 3.0, and further preferably 0.75 to 1.5. When the ratio is in the above-mentioned range, the developer has suitable alkalinity, so excessive dissolution (etching) of the anodized film on the aluminum substrate, the generation of the above-mentioned scum, insoluble dregs by forming the complex between a dissolved aluminum and a silicic acid are prevented. The decrease of the developing performance and the generation of insoluble dregs of condensed silicates are also prevented.

The concentration of the alkali silicates in the developers is preferably 0.5 to 10 wt % in the content to the mass of the aqueous alkali solution, and more preferably 3 to 8 wt %. It is preferable from a viewpoint of the development performance and the disposal of waste fluid that the concentration is in the above-mentioned ranges.

Furthermore, the above-mentioned various surfactants and organic solvents can be added to the developers optionally in order to promote the development, disperse the development dregs, and heighten the ink receptivity of the image areas on the printing plate.

The printing plate developed with the developers having these compositions are subjected to post-treatments with washing water, rinsings containing the surfactants, finishers or protective gum liquids containing gum arabic or starch derivatives as main components. It is possible for the post-treatments of the printing plates of the present invention to use various combinations of the above-mentioned treatments.

The Development Method

In recent years automatic processors for the printing plates have been widely used for rationalization and standardization of plate-making operations in the printing industries. The automatic processors in general consist of a developing part and a post-treatment part and have a unit for conveying the printing plate, respective tanks for treatment solutions and units for spraying wherein the development treatment and post-treatments are carried out by spraying through nozzles the respective treatment solutions pumped up while conveying the exposed printing plate horizontally. Furthermore, a method of performing the development treatment while dipping and conveying the printing plate into treatment solutions filled in tanks with the aid of guide rolls and a method of recycling waste water and as a diluent for the stock solution of the developer, waste water which has been supplied onto a plate surface as a small constant amount of washing water after development and used to wash the plate surface are also known recently.

These automatic treatments can be carried out while supplying the respective replenishers to the treatment solutions depending upon the amounts and operating times of treatment. Furthermore, the throwaway systems which the treatments were carried out by use of substantially virgin treatment solutions can be also applied. The lithographic printing plates prepared by these treatments are set on offset presses and used for producing a great number of printed sheets.

EXAMPLES

The present invention is explained below with reference to examples, but the scope of the present invention is not limited to these examples.

Preparation of Lithographic Printing Starting Plate

Preparation of Aluminum Substrate

An aluminum substrate, which is the support having a hydrophilic surface, was prepared as follows.

A 0.3 mm thick aluminum sheet (1050 material) was degreased by washing it with trichloroethylene, and the surface of the sheet was subjected to graining using a nylon brush and an aqueous suspension of 400 mesh pumice, and then washed well with water. This sheet was immersed in a 25% aqueous solution of sodium hydroxide at 45° C. for 9 sec for etching, washed with water, then immersed in 20% nitric acid for 20 sec, and then washed with water. The amount of etching on the surface thus grained was about 3 g/$m^2$. Subsequently, a 3 g/$m^2$ DC anodized coating was provided on this sheet using 7% sulfuric acid as an electrolytic solution with a current density of 15 A/$dm^2$, it was washed with water, dried, treated with a 2.5 wt % aqueous solution of sodium silicate at 30° C. for 10 sec, and coated with the undercoat solution below, and the coating was dried at 80° C. for 15 sec to give a substrate. The coat weight after drying was 15 mg/$m^2$.

Undercoat Solution

| | |
|---|---|
| Compound (1) below | 0.3 g |
| Methanol | 100 g |
| Water | 1 g |

(1)

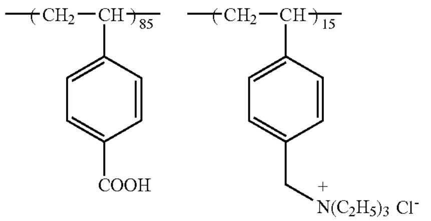

Weight-average molecular weight 26,000

Formation of Heat-sensitive Layer

The aluminum substrate obtained above by the undercoating treatment and a flat SUS substrate for measuring the dissolution rate were coated with a lower layer coating solution having the composition below at a wet coating amount of 19 cc/$m^2$ using a wire bar to give a coat weight of 1.0 g/$m^2$, and dried in a hot air convection heating type continuous feed dryer (dryer oven) at 150° C. for 60 sec. The lower layer thus obtained was subsequently coated with a heat-sensitive layer coating solution described below at a wet coating amount of 7.5 cc/$m^2$ using a wire bar to give a total coat weight of 1.2 g/$m^2$. After coating, it was dried in a dryer at 140° C. for 70 sec in the same manner as above to give a lithographic printing starting plate 1 (treated aluminum substrate) and a lithographic printing starting plate 2 (SUS substrate) of the present invention. The compound (C) of the present invention used for the heat-sensitive layer coating solution is shown in Table 1.

Lower Layer Coating Solution

| | |
|---|---|
| N-(4-Aminosulfonylphenyl)methacrylamide/acrylonitrile/methyl methacrylate copolymer (36/34/30, weight-average molecular weight 50,000) | 1.896 g |
| Cresol novolac (m/p = 6/4, weight-average molecular weight 4,500, residual monomer 0.8 wt %) | 0.237 g |
| Cyanine dye A (structure below) | 0.109 g |
| 2,4,6-Tris(hexyloxy)benzenediazonium 2-hydroxy-4-methoxybenzophenone-5-sulfonate | 0.030 g |
| 4,4'-Bishydroxyphenylsulfone | 0.063 g |
| Tetrahydrophthalic anhydride | 0.190 g |
| p-Toluenesulfonic acid | 0.008 g |
| Ethyl violet, with counter ion changed to 6-hydroxynaphthalenesulfone | 0.05 g |
| Fluorine-based surfactant (Megafac F176, Dainippon Ink and Chemicals, Inc.) | 0.035 g |
| Methyl ethyl ketone | 26.6 g |
| 1-Methoxy-2-propanol | 13.6 g |
| γ-Butyrolactone | 13.8 g |

Cyanine dye A

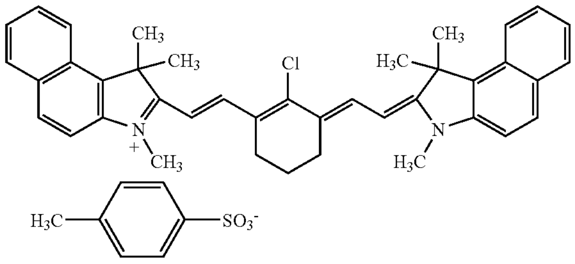

Heat-sensitive Layer Coating Solution

| | |
|---|---|
| m,p-Cresol novolac (m/p ratio = 6/4, weight-average molecular weight 4,500, containing 0.8 wt % of unreacted cresol) | 0.217 g |
| Cyanine dye A (structure above) | 0.055 g |
| Compound (C) of the present invention | 0.070 g |
| Dodecyl stearate | 0.010 g |
| Fluorine-based surfactant (Megafac F176, Dainippon Ink and Chemicals, Inc.) | 0.110 g |
| Fluorine-based surfactant (Megafac MCF-312 (solids content 30%), Dainippon Ink and Chemicals, Inc.) | 0.120 g |
| Methyl ethyl ketone | 15.1 g |
| 1-Methoxy-2-propanol | 7.7 g |

Formation of Heat-sensitive Layer of Comparative Examples

The procedure above was repeated except that the compound (C) of the present invention for the heat-sensitive layer coating solution was not added, and the lower layer coating solution and the heat-sensitive layer coating solution were applied in that order on the undercoated aluminum support and the flat SUS substrate in the same manner as above and dried to give a lithographic printing starting plate 3 (treated aluminum substrate) and a lithographic printing starting plate 4 (SUS substrate) of the Comparative Example having a coat weight of 1.2 g/$m^2$.

Preparation of Developers

Developer A

Developer A was prepared by mixing D-sorbitol (0.22 mol/L), potassium hydroxide (0.22 mol/L), and potassium citrate (18 g/L). The electrical conductivity of this developer A was about 45 mS/cm.

Developer B

Developer B was prepared so as to contain 4 wt % of potassium silicate having a ratio ($SiO_2/K_2O$) of silicon oxide ($SiO_2$) to potassium oxide ($K_2O$) of 1.1, 0.5 wt % of citric acid, and 0.5 wt % of polyethylene glycol lauryl ether. The electrical conductivity of this developer B was about 47 mS/cm.

Examples 1 to 6 and Comparative Examples 1 and 2

Evaluation of Dissolution Discrimination in Development

The lithographic printing starting plate 2 (SUS substrate) of the present invention and the lithographic printing starting plate 4 of the Comparative Example obtained above were exposed to light using a Trendsetter 3244 manufactured by Creo Inc. at a laser output of 9 W, a drum rotational speed of 150 rpm, and an energy of 200 mJ/$cm^2$. The time taken for the upper layer/lower layer of the exposed areas and the unexposed areas to be completely dissolved and removed by the alkaline developer shown in Table 1 was measured using a dissolution rate monitor (DRM, manufactured by PerkinElmer Inc.). The results are shown in Table 1.

TABLE 1

| | Developer | Compound (C) of the present invention used | Dissolution time of unexposed areas (sec) | Dissolution time of exposed areas (sec) | Dissolution discrimination (dissolution time ratio) |
|---|---|---|---|---|---|
| Example 1 | Developer A | Salt of I-2 and (a) | 90 | 2.1 | 42.9 |
| Example 2 | Developer A | Salt of I-6 and (c) | 89 | 2.0 | 44.5 |
| Example 3 | Developer A | Salt of I-7 and (e) | 91 | 2.0 | 45.5 |
| Example 4 | Developer A | Salt of I-16 and (d) | 90 | 1.9 | 47.4 |
| Example 5 | Developer B | Salt of I-7 and (b) | 92 | 2.2 | 41.8 |
| Example 6 | Developer B | Salt of I-18 and (h) | 88 | 1.9 | 46.3 |

TABLE 1-continued

| | Developer | Compound (C) of the present invention used | Dissolution time of unexposed areas (sec) | Dissolution time of exposed areas (sec) | Dissolution discrimination (dissolution time ratio) |
|---|---|---|---|---|---|
| Comparative Example 1 | Developer A | — | 87 | 3.9 | 22.3 |
| Comparative Example 2 | Developer B | — | 88 | 4.0 | 22.0 |

It can be seen from Table 1 that, when the lithographic printing starting plate of the present invention is used, the solubility of the exposed areas is improved without affecting the solubility of the unexposed areas. It can also be seen that the dissolution speed ratio (dissolution time ratio) of the unexposed areas to the exposed areas is increased, and the dissolution discrimination, that is, the development latitude, is improved.

Examples 7 to 10 and Comparative Example 3

Evaluation of Development Latitude

The lithographic printing starting plates 1 (treated aluminum substrate) and the lithographic printing starting plate 3 (treated aluminum substrate) of the Comparative Example obtained above were used for imagewise writing of a test pattern using a Trendsetter 3244 (Creo Inc.) at a laser output of 9 W and a drum rotational speed of 150 rpm.

The lithographic printing starting plates exposed under the conditions described above were developed at a developer temperature of 30° C. for a development time of 12 sec in a PS processor 900H manufactured by Fuji Photo Film Co., Ltd., which was charged with a 1.5 times concentration solution of the developer A.

The treatment was then repeated while gradually diluting the developer with water. The presence or absence of contamination and reduction in the density of image areas stemming from residual recording layer film owing to underdevelopment were then checked. The treatment was further repeated while diluting the developer with water, and the electrical conductivity of the developer at which development could be carried out without problems was measured.

The results are shown in Table 2. When the difference between the upper value and the lower value was large, the development latitude was evaluated as being excellent.

It can be seen from the results of Table 2 that, by employing the lithographic printing starting plate of the present invention as an image formation layer, excellent development latitude can be obtained.

Evaluation of Sensitivity

Lithographic printing starting plate 1 (treated aluminum substrate) and lithographic printing starting plate 3 (treated aluminum substrate) of the Comparative Example obtained above were exposed to a 200 line, 3% to 97% halftone image using a Trendsetter 3244 (Creo Inc.) at various exposure energies, and developed with the developer A at a solution temperature of 30° C. for a development time of 12 sec. The exposure energy required to reproduce a 3% halftone image was defined as the sensitivity. The smaller the exposure energy, the higher the sensitivity. The results are given in Table 2. It can be seen from the results of Table 2 that, by employing the lithographic printing starting plate of the present invention as the image formation layer, excellent sensitivity can be obtained.

TABLE 2

| | Compound (C) of the present invention used | Development latitude (mS/cm) Upper limit | Lower limit | Difference | Sensitivity ($mJ/cm^2$) |
|---|---|---|---|---|---|
| Example 7 | Salt of I-2 and (a) | 49 | 40 | 9 | 135 |
| Example 8 | Salt of I-6 and (c) | 48 | 39 | 9 | 125 |
| Example 9 | Salt of I-7 and (e) | 50 | 41 | 9 | 130 |
| Example 10 | Salt of I-16 and (d) | 49 | 39 | 10 | 135 |
| Comparative Example 3 | — | 48 | 43 | 5 | 190 |

Example 11 and Comparative Example 4

Evaluation of Scratch Resistance of Lithographic Printing Starting Plate

The lithographic printing starting plates 1 (treated aluminum substrate) obtained in Examples 7 to 10 above were abraded twenty times with type CS5 abraser felt using a rotary abrasion tester (TOYOSEIKI) with a load of 250 g. Subsequently, they were developed using a PS Processor 900H (Fuji Photo Film Co., Ltd.) loaded with the developer A at a solution temperature of 30° C. The development times here were adjusted using the sensitivities of Examples 7 to 10 and Comparative Example 3 so that the sensitivities of the lithographic printing starting plates were identical.

When the scratch resistance was evaluated, for the lithographic printing starting plates (Example 11) of the present invention, the optical density of the light-sensitive film in abraded unexposed areas did not change at all, but for the lithographic printing starting plate (Comparative Example 4) of the Comparative Example, it was observed visually that the optical density of the light-sensitive film in the abraded area decreased. It can be seen that the lithographic printing starting plates of the present invention exhibit good scratch resistance.

In accordance with the present invention, with regard to the positive-working lithographic printing starting plate for use in direct platemaking with an infrared laser, the precursor being provided with the heat-sensitive layer, it is possible to obtain a lithographic printing starting plate that has excellent sensitivity, gives excellent development latitude during image formation, suppresses the occurrence of image defects such as defects due to scratches in image areas, and forms a good image.

The invention claimed is:

1. A positive-working lithographic printing starting plate for an infrared laser, comprising:

a support having a hydrophilic surface;

a heat-sensitive layer provided above the support, the heat-sensitive layer comprising a water-insoluble and alkali-soluble resin (A), an infrared-absorbing dye (B), and a sulfonium salt (C) represented by Formula (I), and the heat-sensitive layer increasing its solubility in aqueous alkaline solution upon exposure to an infrared laser (I)

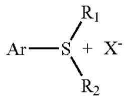

wherein $R_1$ and $R_2$ independently denote an optionally substituted alkyl group having 1 to 12 carbons, an optionally substituted cycloalkyl group having 3 to 8 carbons, an optionally substituted aralkyl group having 7 to 12 carbons, or an optionally substituted aryl group having 6 to 15 carbons, and $R_1$ and $R_2$ may bond to each other to form a cyclic structure; Ar denotes an optionally substituted aromatic hydrocarbon group having 6 to 15 carbons and having at least one OH group at an ortho- and/or para-position; and X denotes an anion of an organic acid; and at least one lower layer containing as a main component a water-insoluble and alkali-soluble resin, the lower layer being provided between the heat-sensitive layer and the support having a hydrophilic surface.

2. The positive-working lithographic printing starting plate for an infrared laser according to claim 1, wherein the alkali-soluble resin (A) is a polymer compound obtained by homopolymerization of one of a polymerizable monomer having a phenolic hydroxyl group, a polymerizable monomer having a sulfonamide group, and a polymerizable monomer having an active imide group, or by copolymerization of two or more monomers thereof, or a polymer compound obtained by copolymerization of one or more monomers of the polymerizable monomers with another copolymerizable monomer.

3. The positive-working lithographic printing starting plate for an infrared laser according to claim 1, wherein the amount of infrared-absorbing dye (B) added is 0.01 to 50 wt % of the total solids content of the heat-sensitive layer.

4. The positive-working lithographic printing starting plate for an infrared laser according to claim 1, wherein the amount of sulfonium salt (C) added is 0.1 to 30 wt % of the total solids content of the heat-sensitive layer.

5. The positive-working lithographic printing starting plate for an infrared laser according to claim 4, wherein the amount of sulfonium salt (C) added is 0.3 to 20 wt % of the total solids content of the heat-sensitive layer.

6. The positive-working lithographic printing starting plate for an infrared laser according to claim 1, wherein X of the sulfonium salt (C) represented by Formula (I) is an anion of an organic acid having a perfluoroalkyl group as a substituent.

7. The positive-working lithographic printing starting plate for an infrared laser according to claim 1, wherein the substituents allowed for $R_1$, $R_2$, and Ar of the sulfonium salt (C) represented by Formula (I) are an alkyl group having 1 to 8 carbons, a cycloalkyl group having 3 to 8 carbons, a haloalkyl group having 1 to 5 carbons, an alkoxy group having 1 to 8 carbons, an amide group, a ureido group, a urethane group, a hydroxyl group, a carboxyl group, a halogen atom, a thioether group, an acyl group having 1 to 5 carbons, an acyloxy group having 1 to 5 carbons, an alkoxycarbonyl group having 1 to 4 carbons, a cyano group, or a nitro group.

8. The positive-working lithographic printing starting plate for an infrared laser according to claim 1, wherein the support is a polyester film or an aluminum sheet.

9. The positive-working lithographic printing starting plate for an infrared laser according to claim 1, wherein it further comprises an organic undercoat layer between the support and the lower layer.

10. The positive-working lithographic printing starting plate for an infrared laser according to claim 9, wherein the coat weight of the organic undercoat layer is 5 to 100 $mg/m^2$.

11. The positive-working lithographic printing starting plate for an infrared laser according to claim 1, wherein the coat weight of the heat-sensitive layer is 0.5 to 3.0 $g/m^2$.

12. The positive-working lithographic printing starting plate for an infrared laser according to claim 1, wherein the coat weight of the heat-sensitive layer is 0.05 to 1.0 $g/m^2$, and the coat weight of the lower layer is 0.3 to 3.0 $g/m_2$.

13. The positive-working lithographic printing starting plate for an infrared laser according to claim 1, wherein the alkali-soluble resin of the lower layer is an acrylic resin having an acidic group whose pKa value is 5 to 11.

14. The positive-working lithographic printing starting plate for an infrared laser according to claim 1, wherein $R_1$ and $R_2$ of the sulfonium salt (C) represented by Formula (I) are independently a methyl group, an ethyl group, a propyl group, an n-butyl group, a sec-butyl group, a hexyl group, a 2-ethylhexyl group, an octyl group, a decanyl group, a dodecyl group, a cyclopropyl group, a cyclopentyl group, a cyclohexyl group, an adamantyl group, a norbornyl group, an isobornyl group, a camphanyl group, a dicyclopentyl group, an α-pinyl group, a tricyclodecanyl group, a benzyl group, a phenethyl group, a naphthylmethyl group, a phenyl group, a tolyl group, a dimethyiphenyl group, a 2,4,6-trimethyiphenyl group, a naphthyl group, an anthryl group, or a 9,10-dimethoxyanthryl group, and Ar is a phenyl, tolyl, dimethyiphenyl, naphthyl, or anthryl group having at least one OH group at an ortho- and/or para-position.

15. The positive-working lithographic printing starting plate for an infrared laser according to claim 1, wherein the amount of alkali-soluble resin added to the lower layer is 70 to 95 wt % of the total solids content of the lower layer.

16. The positive-working lithographic printing starting plate for an infrared laser according to claim 1, wherein an infrared-absorbing dye is added to the lower layer and the amount of infrared-absorbing dye added to the lower layer is 0.5 to 7 wt % of the total solids content of the lower layer.

17. A development method for the positive-working lithographic printing starting plate for an infrared laser according to claim 1, wherein after the lithographic printing starting plate is imagewise exposed to an infrared laser, the lithographic printing starting plate is developed with a developer containing (a) at least one type of sugar selected from non-reducing sugars or at least one type of silicate compound, and (b) at least one type of base, the developer having a pH in the range of 9.0 to 13.5.

18. The positive-working lithographic printing starting plate for an infrared laser according to claim 1, wherein $X^-$ is an anion of acid selected from the group consisting of an alkysulfonic acid, a cycloalkylsulfonic acid, a perfluoroalkylsulfonic acid, an aryl sulfonic acid, an alkylcarboxylic acid, a cycloalkylcarboxylic acid, a perfluoroalkylcarboxylic acid, an arylcarboxylic acid, phosphoric acid, phosphonic acid, an N-sulfonylamide, and an N-sulfonylsulfonamide.

19. The positive-working lithographic printing starting plate for an infrared laser according to claim 1, wherein the amount of sulfonium salt (C) added is 0.5 to 15 wt % of the total solids content of the heat-sensitive layer.

* * * * *